US012683356B2

(12) United States Patent
Koenig et al.

(10) Patent No.: US 12,683,356 B2
(45) Date of Patent: Jul. 14, 2026

(54) RADIATION-EMITTING SEMICONDUCTOR CHIP, AND METHOD FOR PRODUCING SAME

(71) Applicant: ams-Osram International GmbH, Regensburg (DE)

(72) Inventors: Harald Koenig, Bernhardswald (DE); Peter Fuchs, Regensburg (DE); Lars Naehle, Bad Abbach (DE); Christoph Eichler, Donaustauf (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 727 days.

(21) Appl. No.: 18/005,168

(22) PCT Filed: Jul. 5, 2021

(86) PCT No.: PCT/EP2021/068481
§ 371 (c)(1),
(2) Date: Jan. 11, 2023

(87) PCT Pub. No.: WO2022/012988
PCT Pub. Date: Jan. 20, 2022

(65) Prior Publication Data
US 2023/0261436 A1     Aug. 17, 2023

(30) Foreign Application Priority Data
Jul. 13, 2020     (DE) .......................... 102020118405.0

(51) Int. Cl.
*H01S 5/028*          (2006.01)
*H01S 5/026*          (2006.01)
(Continued)

(52) U.S. Cl.
CPC ............ *H01S 5/028* (2013.01); *H01S 5/0265* (2013.01); *H01S 5/042* (2013.01); *H01S 5/4031* (2013.01)

(58) Field of Classification Search
CPC ...... H01S 5/028; H01S 5/0265; H01S 5/4031; H01S 5/026
See application file for complete search history.

(56) References Cited

U.S. PATENT DOCUMENTS 4,779,283 A     10/1988  Ohnaka et al.
5,689,358 A  *  11/1997  Nakao ...................... G02B 6/42
                                                              257/14
(Continued)

FOREIGN PATENT DOCUMENTS

DE          102017111938 A1     12/2018
DE          102018111319 A1     11/2019
(Continued)

OTHER PUBLICATIONS

O. Voegeli et al. "Full-wafer technology for large-scale laser processing and testing" J. Vac. Sci. Technol. B 9, pp. 2886-2892 (1991) (Year: 1191).*

(Continued)

*Primary Examiner* — Xinning(Tom) Niu
*Assistant Examiner* — Delma R Forde
(74) *Attorney, Agent, or Firm* — MH2 Technology Law Group LLP

(57)          ABSTRACT
The invention relates to a radiation-emitting semiconductor chip having the following features: —a semiconductor body including an active region which, during operation, generates electromagnetic radiation and is arranged in a resonator, —at least one recess in the semiconductor body, which recess completely penetrates the active region, wherein—the recess has a first lateral face and a second (Continued)

lateral face opposite the first lateral face, and—the first lateral face has a first coating which specifies a reflectivity for the electromagnetic radiation of the active region, and/or—the second lateral face has a second coating which specifies a reflectivity for the electromagnetic radiation of the active region. The invention further relates to a method for producing such a semiconductor chip.

18 Claims, 21 Drawing Sheets

(51) Int. Cl.
    *H01S 5/042*     (2006.01)
    *H01S 5/40*     (2006.01)

(56) References Cited

U.S. PATENT DOCUMENTS

2004/0233950 A1    11/2004   Furukawa et al.
2006/0140569 A1    6/2006   McDonald

FOREIGN PATENT DOCUMENTS

| | | |
|---|---|---|
| EP | 1304778 A2 | 4/2003 |
| EP | 1826880 A1 | 8/2007 |
| EP | 2302747 A1 | 3/2011 |
| EP | 3664233 A1 | 6/2020 |
| JP | S60187078 A | 9/1985 |
| JP | S6213090 A | 1/1987 |

OTHER PUBLICATIONS

Peter Vettiger et al. "Full-wafer technology a new approach to large-scale laser fabrication and integration" IEEE Journal of Quantum Electronics, vol. 27. No. 6. Jun. 1991, pp. 1319-1331 (Year: 1991).*

Voegelio et al., "Full-Wafer Technology for Large-Scale Laser Processing and Testing", Journal of Vacuum Science and Technology: Part B, AVS/AIP, Melville, NY, vol. 9, No. 6, Nov. 1, 1991, pp. 2886-2892.

Vettiger et al., "Full Wafer Technology—A New Approach to Large-Scale Laser Fabrication and Integration", IEEE Journal of Quantum Electronics, IEEE Service Center, Piscataway, NJ, USA, vol. 27, No. 6, Jun. 1, 1991, pp. 1319-1331.

Tamura et al., "Selective Formation of Dielectric Films on Vertical Surface of Substrate for Photonic Integrated Circuits", IEEE Journal of Quantum Electronics, IEEE Service Center, Piscataway, NJ, USA, vol. 28, No. 7, Jul. 1, 1992, pp. 1727-1731.

International Search Report and Written Opinion dated Oct. 27, 2021, PCT Application No. PCT/EP2021/068481, 19 pages (including English translation).

German Search Report dated Jun. 3, 2021, DE Application No. 102020118405.0, 7 pages.

* cited by examiner

RADIATION-EMITTING SEMICONDUCTOR CHIP, AND METHOD FOR PRODUCING SAME

CROSS-REFERENCE TO RELATED APPLICATIONS

The present application is the national stage entry of International Patent Application No. PCT/EP2021/068481, filed on Jul. 5, 2021, and published as WO 2022/012988 A1 on Jan. 20, 2022, which claims the benefit of priority of German Patent Application No. 10 2020 118 405.0, filed on Jul. 13, 2020, the disclosures of all of which are incorporated by reference herein in their entireties.

FIELD OF THE INVENTION

A radiation-emitting semiconductor chip and a method for producing same are specified.

BACKGROUND OF THE INVENTION

An improved radiation-emitting semiconductor chip is intended to be specified. In particular, an improved radiation-emitting semiconductor chip comprising different segments is intended to be specified. Furthermore, a simplified method for producing such a radiation-emitting semiconductor chip is intended to be specified.

These objects are achieved by means of a radiation-emitting semiconductor chip having the features of patent claim 1 and by means of a method having the steps of patent claim 13.

Advantageous embodiments and developments of the radiation-emitting semiconductor chip and of the method for producing same are specified in the respective dependent claims.

SUMMARY OF THE INVENTION

In accordance with one embodiment, the radiation-emitting semiconductor chip comprises a semiconductor body having an active region which, during operation, generates electromagnetic radiation. Furthermore, the semiconductor body is arranged in a resonator. The resonator is designed in particular to amplify the electromagnetic radiation generated in the active region.

In accordance with one embodiment of the radiation-emitting semiconductor chip, the resonator is configured to amplify the electromagnetic radiation of the active region to form laser radiation.

In this embodiment of the radiation-emitting semiconductor chip, the active region is embodied as a laser medium in which a population inversion is generated during operation in conjunction with a suitable resonator. On account of the population inversion, the electromagnetic radiation is generated in the active region by way of stimulated emission that leads to the formation of electromagnetic laser radiation. On account of the generation of the electromagnetic laser radiation by way of stimulated emission, in contrast to electromagnetic radiation generated by spontaneous emission, the electromagnetic laser radiation generally has a very high coherence length, a very narrow emission spectrum and/or a high degree of polarization.

A length of the resonator is generally embodied in such a way that the electromagnetic laser radiation generated in the active region forms a standing wave within the first resonator. For this purpose, the length of the first resonator generally amounts to an integral multiple of half the wavelength of the electromagnetic laser radiation generated in the active region during operation.

In accordance with a further embodiment of the radiation-emitting semiconductor chip, the semiconductor body comprises at least one cutout which completely penetrates through the active region.

In accordance with a further embodiment of the radiation-emitting semiconductor chip, the cutout has a first side surface and a second side surface opposite the first side surface. By way of example, the cutout has a rectangular basic area. The cutout is embodied for example as a slot. By way of example, the first side surface and the second side surface run parallel to a main extension direction of the slot.

Preferably, a width of the cutout is at most 800 nanometers, at most 15 micrometers, at most 5 micrometers and particularly preferably at most 2 micrometers wide.

The cutout is in particular preferably provided and configured to electrically and/or optically isolate different segments of the semiconductor body from one another. The segments of the semiconductor body can have identical or different functionalities.

In accordance with a further embodiment of the radiation-emitting semiconductor chip, the first side surface has a first coating, which predefines a reflectivity for the electromagnetic radiation of the active region. By way of example, the first coating is applied in direct contact onto the first side surface.

In accordance with a further embodiment of the radiation-emitting semiconductor chip, the second side surface has a second coating, which predefines a reflectivity for the electromagnetic radiation of the active region. By way of example, the second coating is applied in direct contact onto the second side surface.

In accordance with a further embodiment of the radiation-emitting semiconductor chip, the first coating and the second coating are embodied differently from one another.

All features and embodiments described in association with the first coating can also be embodied in the case of the second coating, and vice versa.

The first coating and/or the second coating advantageously set(s) the reflectivity for the electromagnetic radiation of the active region to a predefined value. Particularly preferably, the first coating predefines a different reflectivity for the electromagnetic radiation of the active region. By way of example, the first coating is embodied as antireflective for the electromagnetic radiation of the active region, while the second coating is embodied as highly reflective for the electromagnetic radiation of the active region. It is equally possible for the first coating to be embodied as highly reflective for the electromagnetic radiation of the active region, while the second coating is embodied as antireflective for the electromagnetic radiation of the active region. In this regard, an electrical and/or optical isolation of different segments of the semiconductor body from one another can be attained.

In the present case, the term "highly reflective" is taken to mean, in particular, that the element referred to in this way reflects at least 10%, or at least 20% or at least 40% or at least 80% of incident electromagnetic radiation of the active region.

In the present case, the term "antireflective" is taken to mean, in particular, that the element referred to in this way reflects at most 10% or at most 5% or at most 1% of incident electromagnetic radiation of the active region.

Furthermore, it is also possible for the first coating and/or the second coating to have a predefined reflectivity for the electromagnetic radiation of the active region.

In accordance with a further embodiment of the radiation-emitting semiconductor chip, the first coating is embodied as a first layer sequence having a multiplicity of individual layers. By way of example, the individual layers are formed from two different materials and are arranged alternately. It is also possible to use more than two different materials for the individual layers.

In accordance with a further embodiment of the radiation-emitting semiconductor chip, the second coating is embodied as a second layer sequence having a multiplicity of individual layers.

Preferably, the first coating and/or the second coating comprise(s) a dielectric material or are/is formed from a dielectric material. By way of example, the individual layers comprise a dielectric material or are formed from a dielectric material. Suitable dielectric materials are for example compounds from the group of the oxides or nitrides or oxynitrides of Al, Ce, Ga, Hf, In, Mg, Nb, Rh, Sb, Si, Sn, Ta, Ti, Zn, Zr.

By way of example, the first layer sequence and the second layer sequence are formed from individual layers of identical materials and with an identical succession, wherein a thickness of the first layer sequence in the region of the first side surface and a thickness of the second layer sequence in the region of the second side surface are embodied differently from one another.

In accordance with a further embodiment of the radiation-emitting semiconductor chip, the thickness of the first layer sequence in the region of the first side surface and a thickness of the second layer sequence in the region of the second side surface are in a ratio of between 1:1 and not more than 1:20, preferably between 1:1 and not more than 1:10, particularly preferably between not less than 1:1.5 and not more than 1:4.5.

In accordance with a further embodiment of the radiation-emitting semiconductor chip, the thickness of the first layer sequence in the region of the first side surface and a thickness of the second layer sequence in the region of the second side surface are in a ratio of greater than 1:1 and less than or equal to 1:20, preferably greater than 1:1 and less than or equal to 1:10, particularly preferably greater than 1:1.5 and less than or equal to 1:4.5.

In accordance with a further embodiment of the radiation-emitting semiconductor chip, the thickness of the second layer sequence in the region of the second side surface and a thickness of the first layer sequence in the region of the first side surface are in a ratio of between 1:1 and not more than 1:20, preferably between 1:1 and not more than 1:10, particularly preferably between not less than 1:1.5 and not more than 1:4.5.

In accordance with a further embodiment of the radiation-emitting semiconductor chip, the thickness of the second layer sequence in the region of the second side surface and a thickness of the first layer sequence in the region of the first side surface are in a ratio of greater than 1:1 and less than or equal to 1:20, preferably greater than 1:1 and less than or equal to 1:10, particularly preferably greater than 1:1.5 and less than or equal to 1:4.5.

In accordance with a further embodiment of the radiation-emitting semiconductor chip, the second layer sequence is embodied in identical fashion to the first layer sequence apart from an additional symmetry breaking layer. The symmetry breaking layer can be an individual layer or a layer sequence. Alternatively, it is also possible for the first layer sequence to be embodied in identical fashion to the second layer sequence apart from an additional symmetry breaking layer. In particular, a different embodiment of the first layer sequence and of the second layer sequence, for example by the inclusion of a symmetry breaking layer sequence in one of the two layer sequences, results in different optical properties of the first coating and of the second coating.

In accordance with a further embodiment, the radiation-emitting semiconductor chip comprises a semiconductor body having a first segment and a second segment, the first segment being electrically and/or optically isolated from the second segment by the cutout. The first segment and the second segment have different functionalities, for example. Furthermore, it is also possible for a plurality of segments of the semiconductor body to have the same functionality. The first segment and the second segment are arranged particularly preferably in a lateral direction next to one another along a main extension direction of the semiconductor body. By way of example, a first contact location is applied on the first segment and a second contact location is applied on the second segment. The two contact locations are configured to electrically contact the two segments independently of one another.

The semiconductor body can also comprise more than two segments. Only two segments are discussed in detail below, for the sake of simplicity. All embodiments and features disclosed in association with the first and second segments can also be embodied in the case of further segments.

In accordance with a further embodiment of the radiation-emitting semiconductor chip, the first segment comprises the resonator and the second segment comprises a modulation element configured to modulate an intensity of the electromagnetic radiation of the active region. By way of example, in the first segment, electromagnetic radiation is generated, preferably electromagnetic laser radiation, which enters the modulation element through the cutout. The modulation element can be adjusted so as to be transmissive through to absorbent for the electromagnetic radiation of the active region by means of a variation in the energization, in particular by means of electrical control including reverse voltage and forward current, via the second contact location. If the modulation element is embodied as absorbent for the electromagnetic radiation from the resonator, then the modulation element is embodied as an absorber element.

In accordance with a further embodiment of the radiation-emitting semiconductor chip, the first segment and the second segment are electrically isolated from one another, and the second segment comprises an electrical switching element configured to switch on and to switch off the radiation-emitting semiconductor chip.

In accordance with a further embodiment of the radiation-emitting semiconductor chip, the semiconductor body has a segment comprising one or more of the following elements: photodiode, passive waveguide, active waveguide, beam splitter, beam combiner, lens, wavelength-selective element, phase shifting elements, frequency doubler, taper, amplifier, converter, transistor.

In accordance with one embodiment, the radiation-emitting semiconductor chip emits laser radiation, preferably from a laterally arranged facet.

Furthermore, it is also possible for the radiation-emitting semiconductor chip to be embodied as a superluminescence diode, in which case, although amplification of the electromagnetic radiation generated in the active region takes place within a resonator, complete laser operation is not attained.

By way of example, the first coating and the second coating completely fill the cutout. Furthermore, it is also possible that, between the first coating and the second coating, a region of the cutout remains free of the first coating and the second coating. That region of the cutout which remains free of the first coating and the second coating can be filled with a further material, preferably with a dielectric, such as silicon dioxide, titanium dioxide, silicon nitride. In this regard, a loss of electromagnetic radiation on account of large differences in refractive index between semiconductor and dielectric in the course of coupling into the second element can be at least reduced.

In accordance with a further embodiment of the radiation-emitting semiconductor chip, a refractive index progression along the main extension direction of the semiconductor chip proceeding from the first side surface of the cutout as far as the second side surface of the cutout is embodied in nonperiodic fashion.

The radiation-emitting semiconductor chip described in the present case is suitable in particular for being comprised by an array. In accordance with one embodiment of the array, the latter comprises at least two radiation-emitting semiconductor chips such as have already been described here. All embodiments and features described in association with the radiation-emitting semiconductor chip in the present case can also be embodied in the case of the array, and vice versa.

In particular, the radiation-emitting semiconductor chips of the array are embodied integrally with one another. In other words, the radiation-emitting semiconductor chips are not firstly produced as separate elements and later combined to form an array, but rather are embodied monolithically together with one another.

The radiation-emitting semiconductor chip can be produced by the method described below, for example. All features and embodiments described in association with the radiation-emitting semiconductor chip in the present case can also be embodied in the case of the method, and vice versa.

In accordance with one embodiment of the method, a semiconductor body is provided which comprises an active region which, during operation, generates electromagnetic radiation and is arranged in a resonator.

In accordance with a further embodiment of the method, at least one cutout which completely penetrates through the active region is produced in the semiconductor body. In this case, the cutout has a first side surface and a second side surface, the first side surface being arranged opposite the second side surface. By way of example, the cutout is produced by etching.

In accordance with a further embodiment of the method, a first coating, which predefines a reflectivity for the electromagnetic radiation of the active region, is applied to the first side surface.

In accordance with a further embodiment of the method, a second coating, which predefines a reflectivity for the electromagnetic radiation of the active region, is applied to the second side surfaces.

In accordance with a further embodiment of the method, the second side surface of the cutout is provided with a protective layer. In a next step, the first side surface of the cutout is provided with the first coating and the protective layer is removed again, such that the semiconductor body is freely accessible in the region of the second side surface. In this case, by way of example, a photoresist layer is used as the protective layer.

In this method, the first coating and/or the second coating can be deposited for example by means of vapor deposition, sputtering, atomic layer deposition (ALD method for short) or chemical vapor deposition (CVD method for short).

In the case of vapor deposition and in the case of sputtering, the surface to be coated is provided in a volume. At least one starting material in the vapor phase is furthermore provided in the volume. The starting material condenses directly on the surface and thus forms a coating on the surface. In the case of vapor deposition the starting material is converted into the vapor phase by application of temperature, while in the case of sputtering the starting material is converted into the vapor phase by ion bombardment. Vapor deposition and sputtering are generally directional deposition methods in which more material is deposited along a preferred direction than along the other directions.

In the case of the CVD method, the surface to be coated is likewise made available in a volume. At least one starting material is furthermore made available in the volume and a solid coating is deposited from it by way of a chemical reaction on the surface to be coated. In general, the volume contains at least one second starting material with which the first starting material reacts chemically to form the solid coating on the surface. The CVD method is thus distinguished by at least one chemical reaction on the surface to be coated to form the CVD layer. More than two starting materials can also be used in chemical vapor deposition.

In the present case, atomic layer deposition denotes a method in which the first gaseous starting material is fed to the volume in which the surface to be coated is provided, such that the first gaseous starting material adsorbs on the surface. After preferably complete or almost complete coverage of the surface with the first starting material, that part of the first starting material which is still gaseous or has not adsorbed on the surface is generally removed again from the volume and the second starting material is fed in. The second starting material is provided for reacting chemically with the first starting compound that has adsorbed on the surface to form a solid coating.

The CVD method and the ALD method are generally nondirectional, also called isotropic, deposition methods in which the material is deposited uniformly along all directions.

In accordance with a further embodiment of the method, the first coating is provided with a further protective layer at least in the region of the first side surface. This step generally takes place after the first coating has been applied to the first side surface. The second side surface particularly preferably remains free of the protective layer.

In accordance with a further embodiment of the method, the second side surface of the cutout is provided with the second coating and the further protective layer is removed again, such that the first coating is freely accessible in the region of the first side surface. This preferably takes place after the second coating has been applied. Two coatings that are different from one another can advantageously be produced with the aid of the two protective layers.

As described above, the first coating and the second coating can be applied to the first side surface and the second side surface of the cutout in steps carried out temporally successively.

In accordance with a further embodiment of the method, the first coating and the second coating are simultaneously applied to the first side surface and the second side surface. In this embodiment of the method, preferably, the first coating is embodied as a first layer sequence of a multiplicity of individual layers and the second coating is embodied as a second layer sequence of a multiplicity of second individual layers. Particularly preferably, in this embodiment of the method, the first layer sequence and the second layer sequence have individual layers of identical materials and with an identical succession. Particularly preferably, the first layer sequence and the second layer sequence differ in their thicknesses, however. Preferably, a thickness of the first layer sequence in the region of the first side surface and a thickness of the second layer sequence in the region of the second side surface are in a ratio of between 1:1 and not more than 1:20, preferably between 1:1 and not more than 1:10, particularly preferably between not less than 1:1.5 and not more than 1:4.5.

In order to produce such coatings, a deposition method is preferably used in which a preferred direction for applying the first coating and the second coating forms a predefined angle with a main extension plane of the semiconductor body. The angle is preferably not equal to 90°. In this regard, a first coating and a second coating can be attained whose thicknesses on the first side surface and the second side surface are different from one another, but they have the same materials and successions of individual layers. In other words, a directional deposition method, such as thermal evaporation or sputtering, is particularly preferably used in this case.

In accordance with a further embodiment of the method, before the first coating and the second coating are applied, a shading element is applied to a region of a main surface of the semiconductor body which directly adjoins the first side surface of the cutout, such that the thickness of the first coating in the region of the side surface is different from the thickness of the second coating in the region of the second side surface. With the aid of a shading element, too, it is thus possible for a first coating and a second coating to be simultaneously applied to the side surfaces of the cutout, which have different thicknesses at least in the region of the first side surface and the second side surface.

In accordance with a further embodiment of the method, the first coating is embodied as a first layer sequence of a multiplicity of individual layers. In accordance with a further embodiment of the method, the second coating is embodied as a second layer sequence of a multiplicity of individual layers.

In accordance with a further embodiment of the method, a multiplicity of semiconductor bodies are provided in a wafer assemblage. Separating trenches are then arranged between the semiconductor bodies. Preferably, a respective separating trench runs between two side surfaces of two directly adjacent semiconductor bodies. A layer sequence comprising a first layer and a second layer is then deposited in the separating trenches and the semiconductor bodies are singulated along the separating trenches in such a way that the first layer is arranged on a side surface of one semiconductor body and the second layer is arranged on a side surface of a directly adjacent semiconductor body. The first layer and the second layer can each consist of one individual layer or comprise a layer sequence having a plurality of individual layers.

Further advantageous embodiments and developments of the radiation-emitting semiconductor chip and the method for producing same will become apparent from the exemplary embodiments described below in association with the figures.

DETAILED DESCRIPTION

Elements that are identical, of identical type or act identically are provided with the same reference signs in the figures. The figures and the size relationships of the elements illustrated in the figures among one another should not be regarded as to scale. Rather, individual elements, in particular layer thicknesses, may be illustrated with exaggerated sizes in order to enable better illustration and/or in order to afford a better understanding.

In the method in accordance with the exemplary embodiment in FIGS. 1 to 4, a first step involves providing a semiconductor body 1 (not illustrated). The semiconductor body 1 has an active region 2 which, during operation, generates electromagnetic radiation. The semiconductor body 1 is arranged on a substrate 3.

Figure 1:
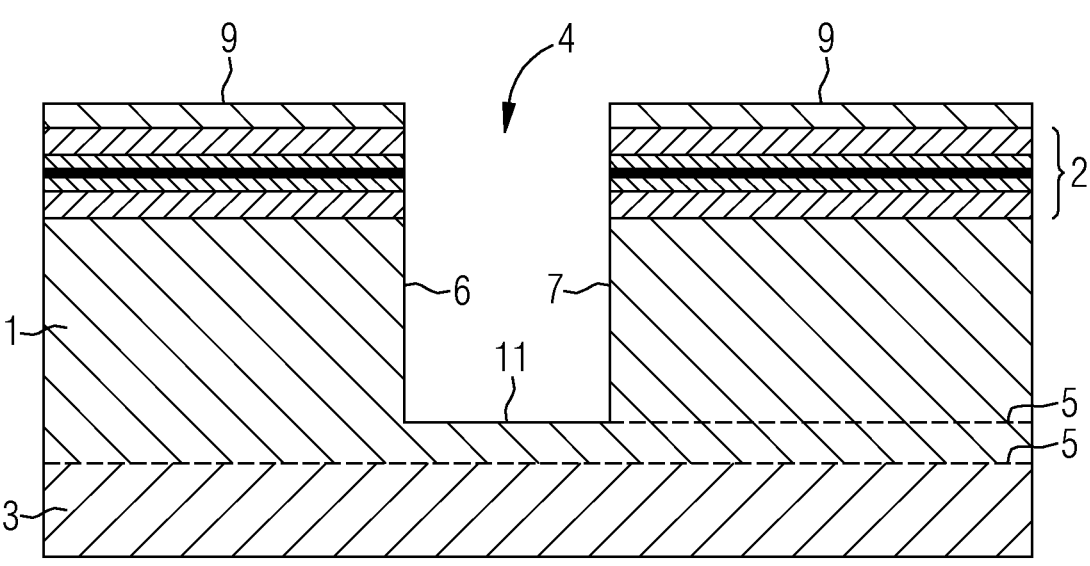
FIGS. 1 to 4 show schematic sectional illustrations of different stages of a method in accordance with one exemplary embodiment.
Figure 2:
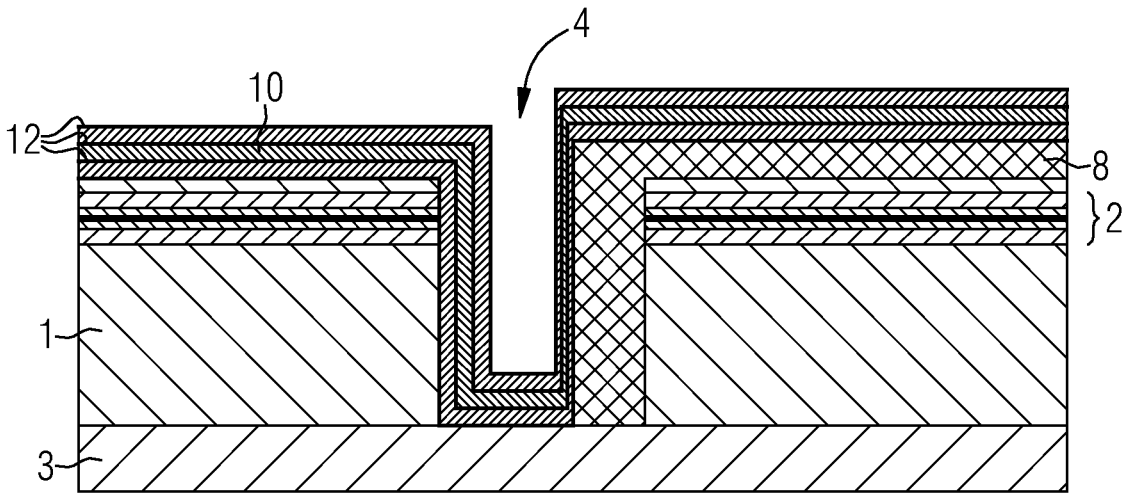

A cutout 4 which completely penetrates through the active region 2 is produced in the semiconductor body 1 (FIG. 1). The cutout 4 is produced by etching, for example. Furthermore, etch stop layers 5 can be arranged in the semiconductor body 1, said layers stopping an etching process of the cutout 4. In this regard, a depth of the cutout 4 can be defined.

The cutout 4 has a first side surface 6 and a second side surface 7 opposite the first side surface 6. A protective layer 8 is applied at least to the second side surface 7. In the present case, the protective layer 8 also extends over that region of a main surface 9 of the semiconductor body 1 which directly adjoins the second side surface 7. The protective layer 8 is a photoresist layer, for example.

Figure 3:
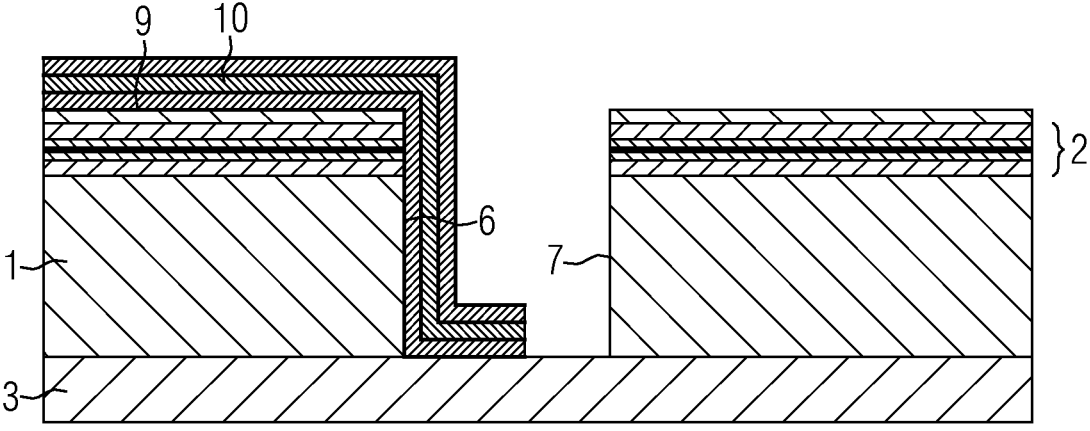

After the protective layer 8 has been applied, a first coating 10 is deposited (FIG. 2) and the protective layer 8 is removed again, such that the first coating 10 is applied only on the first side surface 6 of the cutout 4, parts of a bottom surface 11 of the cutout 4 and on a region of the main surface 9 of the semiconductor body 1 which directly adjoins the cutout 4 (FIG. 3). In the present case, the first coating 6 is formed from a multiplicity of individual layers 12 which comprise two different materials and are arranged alternately. It is also possible to use more than two different materials for the individual layers. By way of example, the first coating 10 is embodied as antireflective for the electromagnetic radiation generated in the active region 2.

Figure 4:
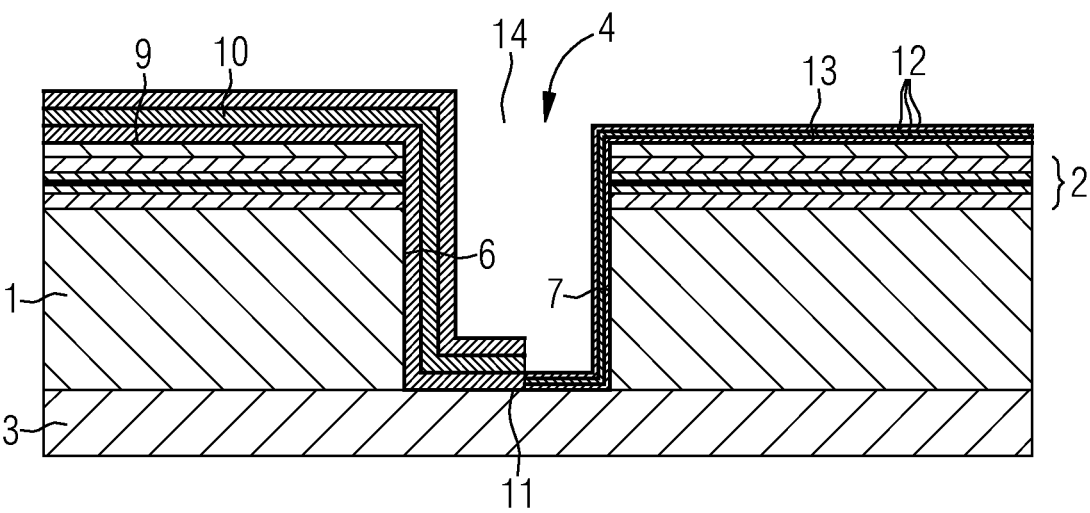

In a next step, a further protective layer 8 is applied (not illustrated) to the first coating 6 and a second coating 13 is deposited. The second protective layer 8 is then removed again, such that the second coating 13 is applied only on the second side surface 7 of the cutout 4, parts of the bottom surface 11 of the cutout 4 and in that region of the main surface 9 of the semiconductor body 1 which directly adjoins the second side surface 7 (FIG. 4). In the present case, the second coating 13 is embodied as highly reflective for the electromagnetic radiation generated in the active region 2.

Figure 5:
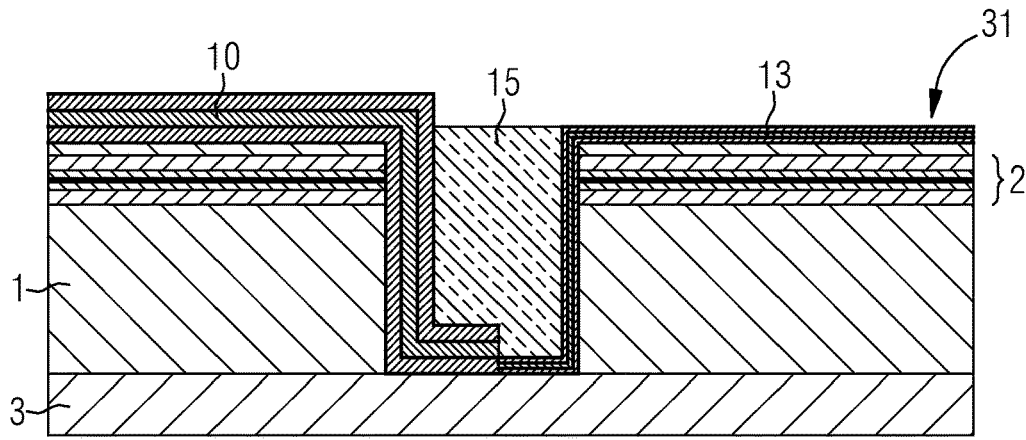
FIG. 5 shows a schematic sectional illustration of a radiation-emitting semiconductor chip in accordance with one exemplary embodiment.

The radiation-emitting semiconductor chip 31 in accordance with the exemplary embodiment in FIG. 5 has a semiconductor body 1 arranged on a substrate 3. A cutout 4 having a first side surface 6 and a second side surface 7 opposite the first side surface 6 is arranged in the semiconductor body 1. A first coating 10 is applied to the first side surface 6, which first coating in the present case likewise partly extends over a bottom surface 11 of the cutout 4 and also over a main surface 9 adjoining the first side surface 6. A second coating 13 is arranged on a second side surface 7 of the cutout 4, which second coating likewise extends over parts of the bottom surface 11 of the cutout 4 and also the main surface 9 of the semiconductor body 1 adjoining the second side surface 7. In the present case, the region 14 of the cutout 4 which remains free of the first coating 6 and the second coating 7 is completely filled with a dielectric 15.

Figure 6:
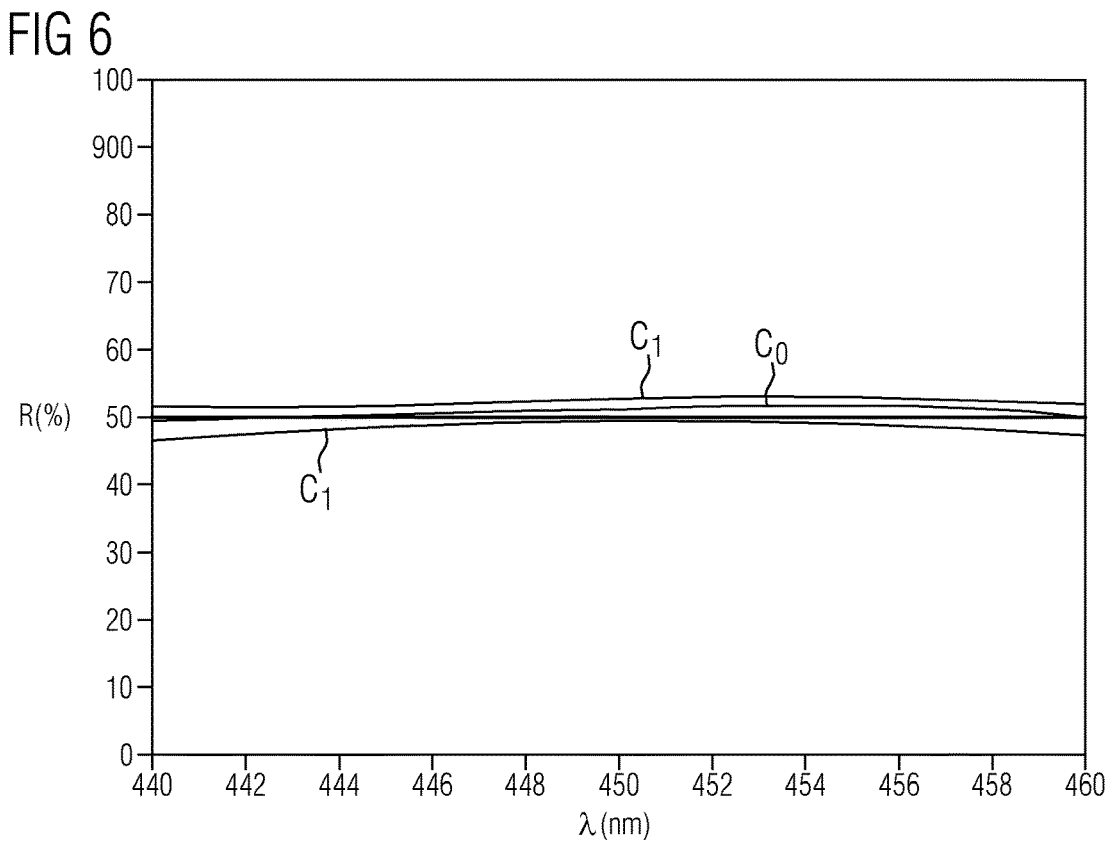
FIGS. 6 and 7 each show simulated values of the reflectivity R as a function of the wavelength 2 of incident electromagnetic radiation for a coating in accordance with one exemplary embodiment.

FIG. 6 shows simulated values of the reflectivity R as a function of the wavelength 2, of incident electromagnetic radiation for a first coating 10 and a second coating 13 each having a multiplicity of individual layers 12, the material, thickness, refractive index and order of which are indicated in table 1.

TABLE 1

| | Material | Thickness (nanometers) | Refractive index n |
|---|---|---|---|
| | Laser | | 2.5 |
| First coating | SiO₂ | 88 | 1.5 |
| First coating | TiO₂ | 128 | 2.2 |

TABLE 1-continued

| | Material | Thickness (nanometers) | Refractive index n |
|---|---|---|---|
| First coating | SiO₂ | 102 | 1.5 |
| First coating | TiO₂ | 56 | 2.2 |
| Cutout | SiO₂ | 1000 | 1.5 |
| Second coating | TiO₂ | 11 | 2.2 |
| Second coating | SiO₂ | 38 | 1.5 |
| Second coating | TiO₂ | 147 | 2.2 |
| Second coating | SiO₂ | 7 | 1.5 |
| | Laser | | 2.5 |

In the exemplary embodiment in FIG. 6, the first coating 10 and the second coating 13 are applied independently of one another, as has already been described with reference to FIGS. 1 to 4, for example. The region of the cutout between the two coatings is filled with a 1000 nanometer thick SiO₂ layer.

Here and in the following figures, the curve C0 shows the reflectivity of the coatings 6, 7, while the curve C1 shows the reflectivity upon variation of the thickness of the coatings 6, 7 by 2% (at least 2 nanometers) and upon variation of the thickness of the central SiO₂ layer or of the central TiO₂ layer by +/−500 nanometers.

Figure 7:
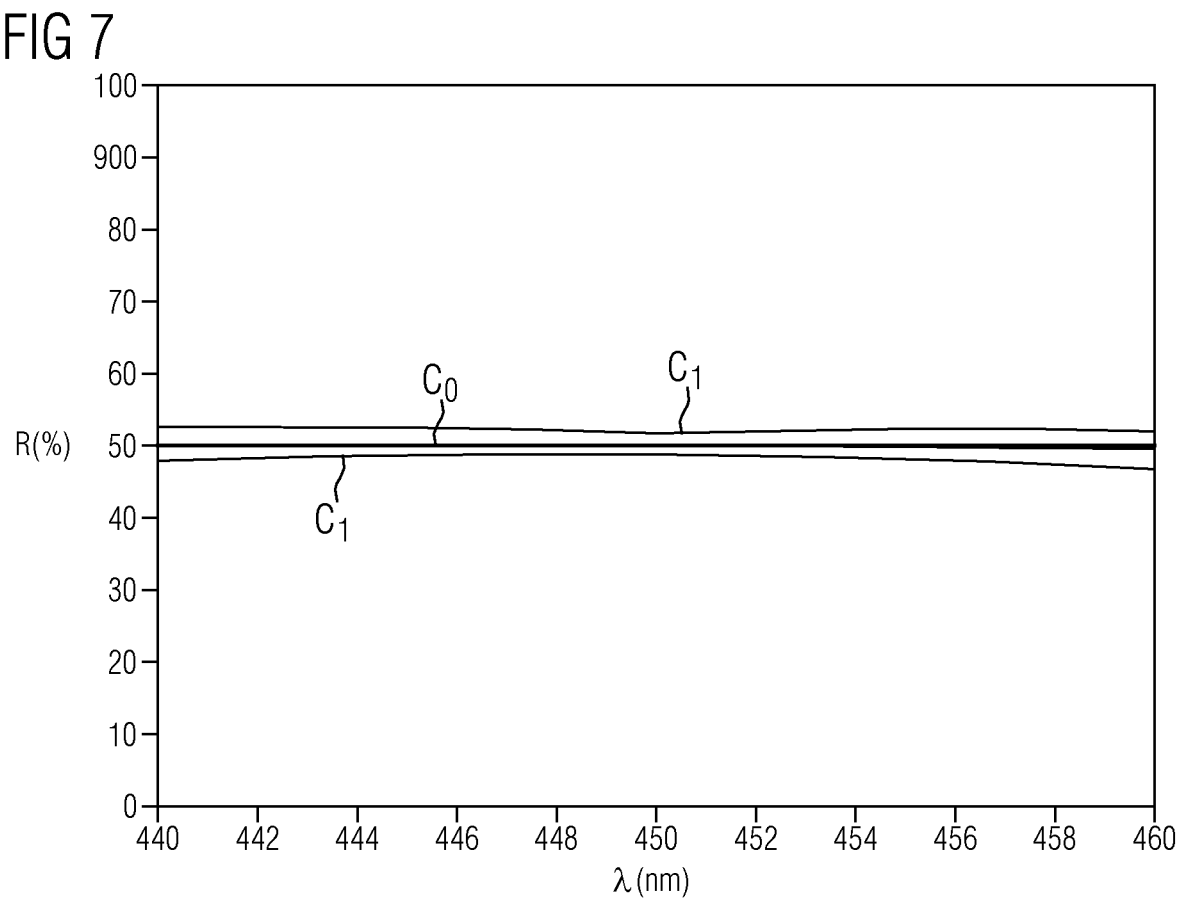

FIG. 7 shows simulated values of the reflectivity R as a function of the wavelength λ of incident electromagnetic radiation for a first coating and a second coating each having a multiplicity of individual layers, the material, thickness, refractive index and order of which are indicated in table 2.

TABLE 2

| | Material | Thickness (nanometers) | Refractive index n |
|---|---|---|---|
| | Laser | | 2.5 |
| First coating | SiO₂ | 78 | 1.5 |
| First coating | TiO₂ | 51 | 2.2 |
| First coating | SiO₂ | 102 | 1.5 |
| First coating | TiO₂ | 126 | 2.2 |
| Cutout | SiO₂ | 1000 | 1.5 |
| Second coating | TiO₂ | 11 | 2.2 |
| Second coating | SiO₂ | 34 | 1.5 |
| Second coating | TiO₂ | 58 | 2.2 |
| | Laser | | 2.5 |

In the exemplary embodiment in FIG. 7, too, the first coating and the second coating 13 are applied independently of one another, as has already been described with reference to FIGS. 1 to 4, for example.

Figure 8:
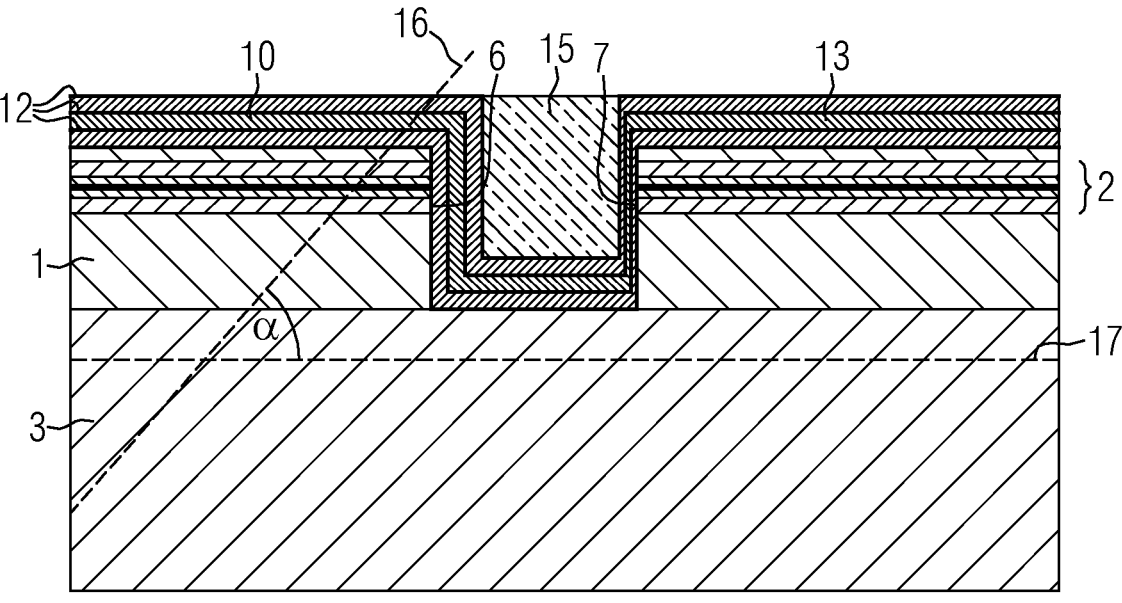
FIG. 8 shows a schematic sectional illustration of one stage of a method in accordance with one exemplary embodiment.

In contrast to the method in accordance with the exemplary embodiment in FIGS. 1 to 4, in which the first coating 10 and the second coating 13 are deposited successively, the first coating 10 and the second coating 13 are deposited simultaneously on the semiconductor body 1 in the method in accordance with the exemplary embodiment in FIG. 8. A deposition method having a preferred direction 16 having an angle α with a main extension plane 17 of the semiconductor body 1 is used for this purpose.

In this regard, the first coating 10 and the second coating 13 are deposited simultaneously, the second coating 13 at least on the second side surface 7 having a different thickness than the first coating 10 on the first side surface 6. This is attained by means of self-shading of the cutout 4 during deposition on account of the preferred direction 16. Examples of suitable directional deposition methods are sputtering or vapor deposition.

The first coating 10 and the second coating 13 attained by the method in accordance with the exemplary embodiment in FIG. 8 have layer sequences of individual layers 12 of identical material and with an identical succession. The first coating 10 and the second coating 13 differ only in their thickness on the first side surface 6 and the second side surface 7 of the cutout 4.

Figure 9:
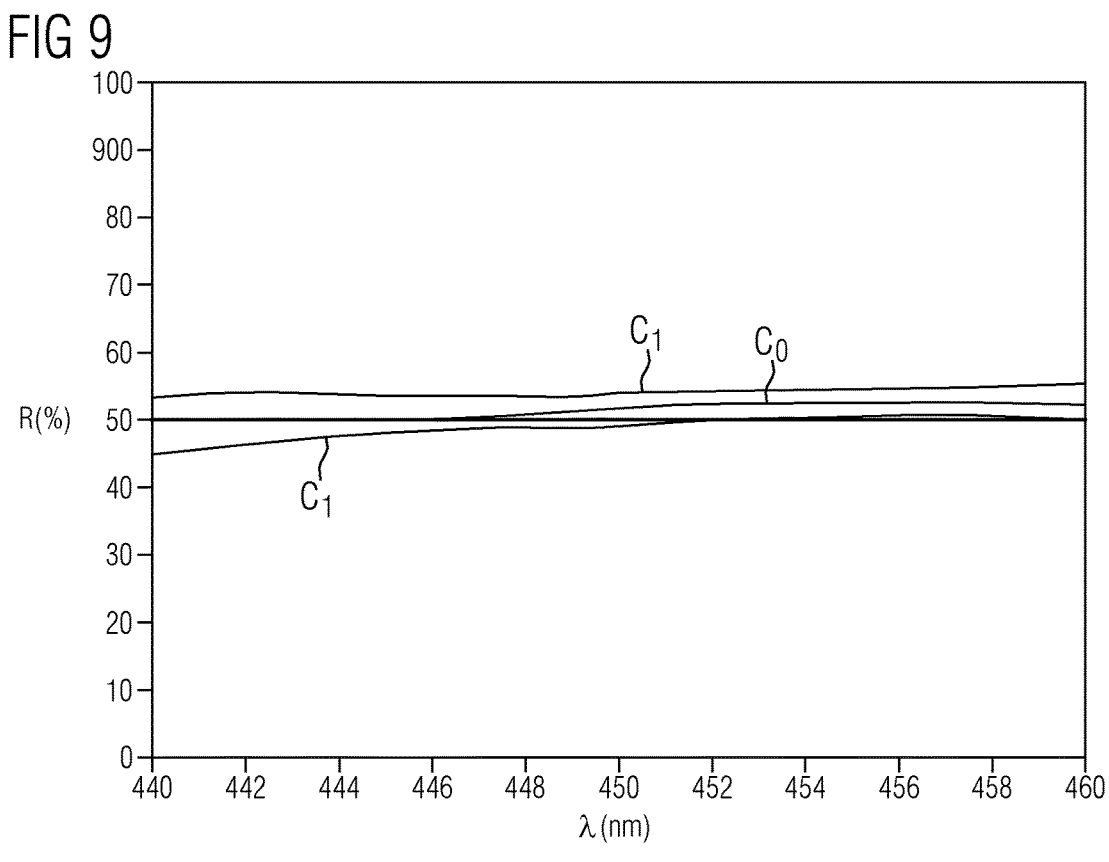
FIGS. 9 and 10 each show simulated values of the reflectivity R as a function of the wavelength 2 of incident electromagnetic radiation for a coating in accordance with one exemplary embodiment.

FIG. 9 shows simulated values of the reflectivity R as a function of the wavelength λ of incident electromagnetic radiation for a first coating and a second coating each having a multiplicity of individual layers, the material, thickness, refractive index and order of which are indicated in table 3.

TABLE 3

| | Material | Thickness (nanometers) | Refractive index n |
|---|---|---|---|
| | Laser | | 2.5 |
| First coating | SiO$_2$ | 150 | 1.5 |
| First coating | TiO$_2$ | 145 | 2.2 |
| First coating | SiO$_2$ | 117 | 1.5 |
| First coating | TiO$_2$ | 89 | 2.2 |
| Cutout | SiO$_2$ | 1000 | 1.5 |
| Second coating | TiO$_2$ | 44.5 | 2.2 |
| Second coating | SiO$_2$ | 58.5 | 1.5 |
| Second coating | TiO$_2$ | 72.5 | 2.2 |
| Second coating | SiO$_2$ | 75 | 1.5 |
| | Laser | | 2.5 |

In the exemplary embodiment in FIG. 9, the first coating 10 and the second coating 13 are applied simultaneously, as already described with reference to FIG. 8. The first coating 10 and the second coating 13 have individual layers 12 of identical material and with an identical succession. However, the first coating 10 and the second coating 13 differ with regard to their thicknesses. A ratio of the thickness of the first coating 10 to the thickness of the second coating 13 is approximately 2:1.

Figure 10:
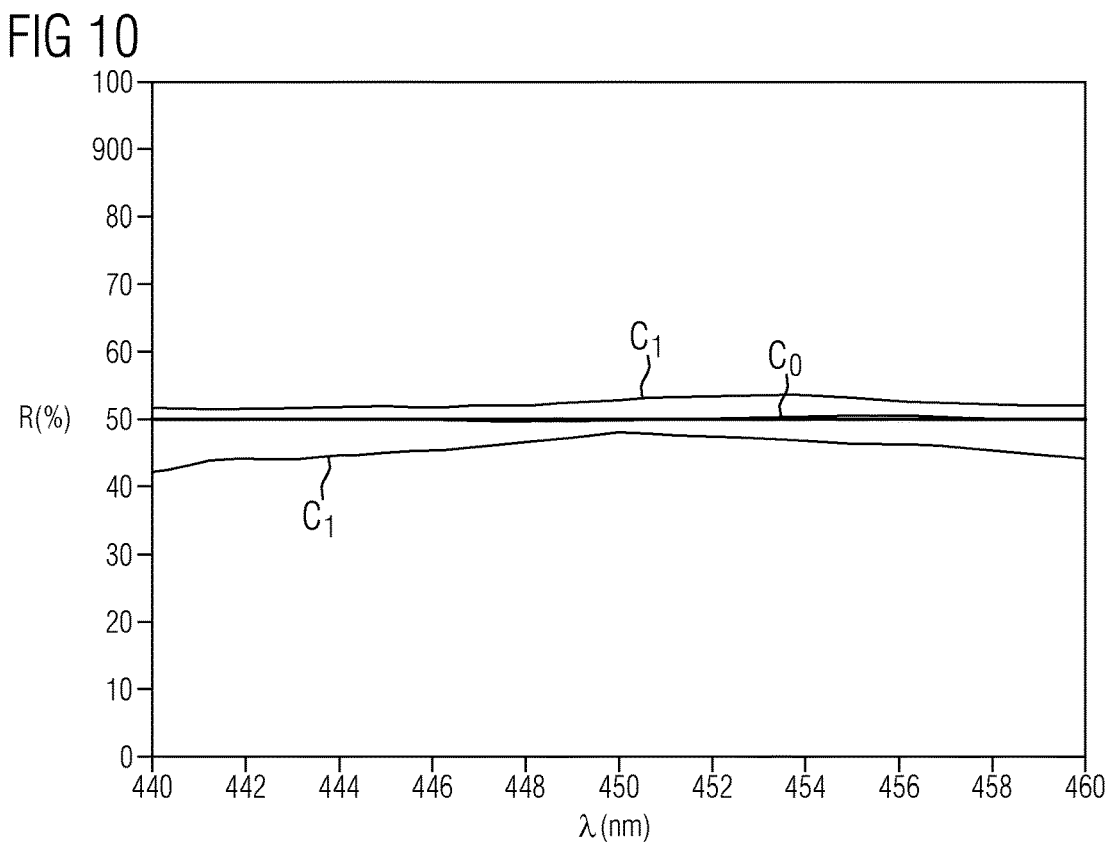

FIG. 10 shows simulated values of the reflectivity R as a function of the wavelength λ, of incident electromagnetic radiation for a first coating 10 and a second coating 13 each having a multiplicity of individual layers 12, the material, thickness, refractive index and order of which are indicated in table 4.

TABLE 4

| | Material | Thickness (nanometers) | Refractive index n |
|---|---|---|---|
| | Laser | | 2.5 |
| First coating | SiO$_2$ | 68 | 1.5 |
| First coating | TiO$_2$ | 173 | 2.2 |

TABLE 4-continued

| | Material | Thickness (nanometers) | Refractive index n |
|---|---|---|---|
| First coating | SiO$_2$ | 185 | 1.5 |
| First coating | TiO$_2$ | 65 | 2.2 |
| Cutout | SiO$_2$ | 1000 | 1.5 |
| Second coating | TiO$_2$ | 16.2 | 2.2 |
| Second coating | SiO$_2$ | 46.2 | 1.5 |
| Second coating | TiO$_2$ | 43.2 | 2.2 |
| Second coating | SiO$_2$ | 17 | 1.5 |
| | Laser | | 2.5 |

In the exemplary embodiment in FIG. 10, the first coating 10 and the second coating 13 are applied simultaneously, as already described with reference to FIG. 8. The first coating 10 and the second coating 13 have individual layers 12 of identical material and with an identical succession. However, the first coating 10 and the second coating 13 differ with regard to their thicknesses. A ratio of the thickness of the first coating 10 to the thickness of the second coating 13 is approximately 4:1.

Figure 11:
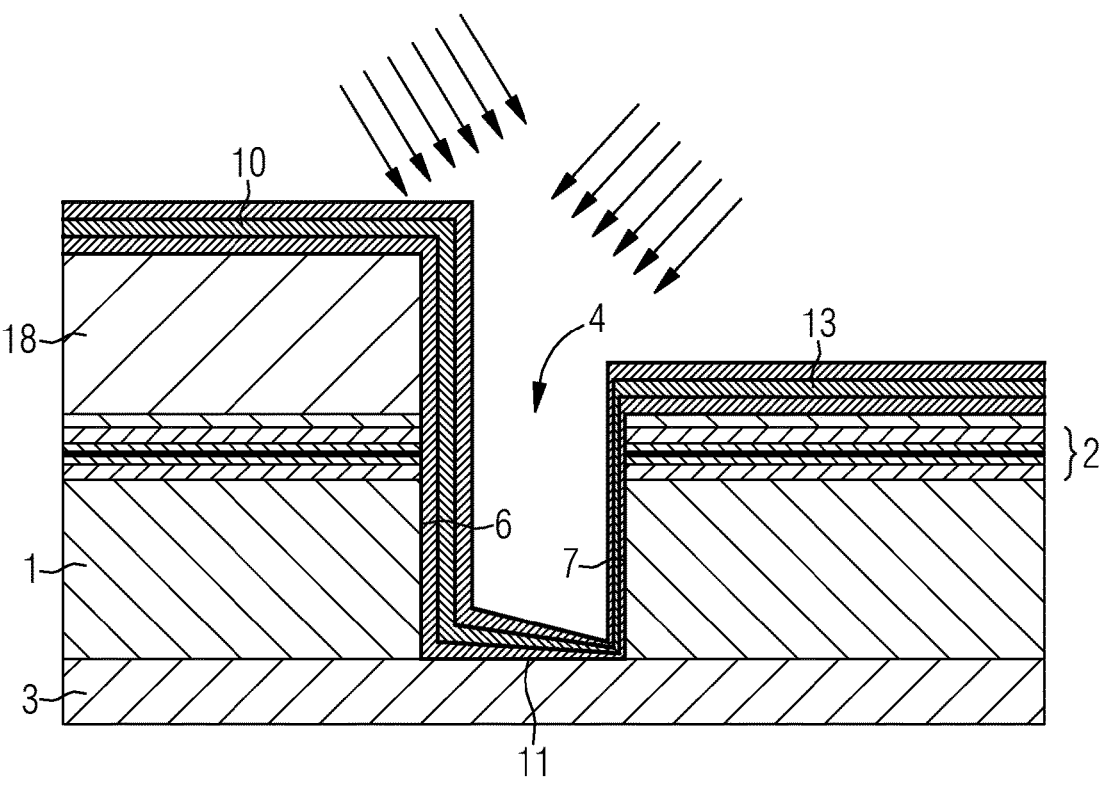
FIG. 11 shows a schematic sectional illustration of one stage of a method in accordance with a further exemplary embodiment.

A first coating 10 and a second coating 13 such as are attained by the method in accordance with the exemplary embodiment in FIG. 8 can also be attained by the method in accordance with the exemplary embodiment in FIG. 11.

In the method in accordance with the exemplary embodiment in FIG. 11, a shading element 18 is applied to a region of a main surface 9 of the semiconductor body 1 which directly adjoins a first side surface 6 of a cutout 4 in the semiconductor body 1. A first coating 10 and a second coating 13 are then deposited simultaneously, such that a thickness of the first coating 10 on the first side surface 6 is different from the thickness of the second coating 13 on the second side surface 7 on account of the shading element 18.

Figure 12:
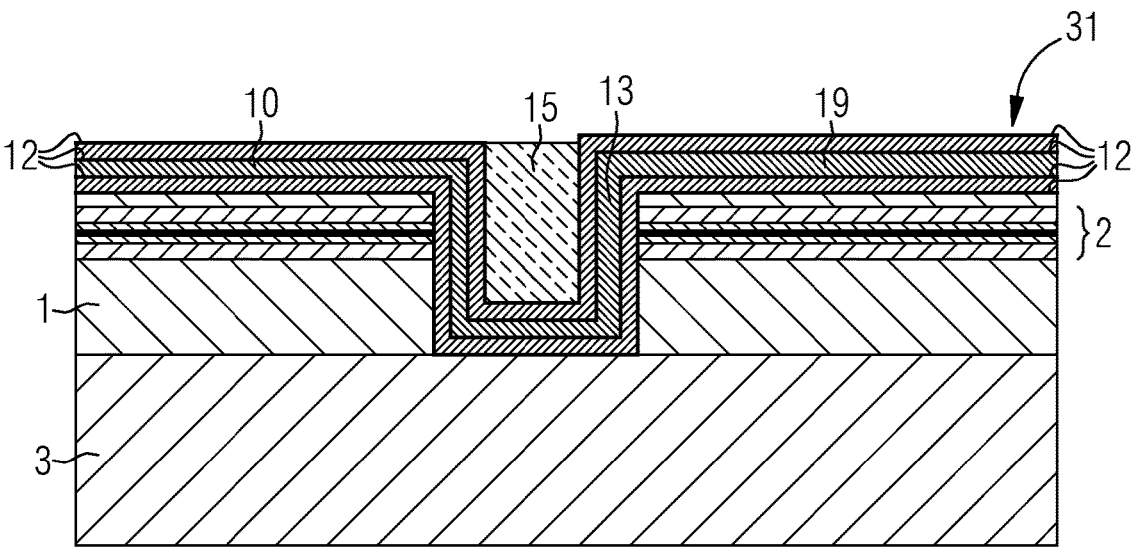
FIG. 12 shows a schematic sectional illustration of a radiation-emitting semiconductor chip in accordance with one exemplary embodiment.

The radiation-emitting semiconductor chip 31 in accordance with the exemplary embodiment in FIG. 12 has a first coating 10 and a second coating 13, which coatings are embodied in identical fashion apart from a symmetry breaking layer 19 within the second coating 13. The symmetry breaking layer 19 can be produced with the aid of a photoresist layer and a lift-off method.

Figure 13:
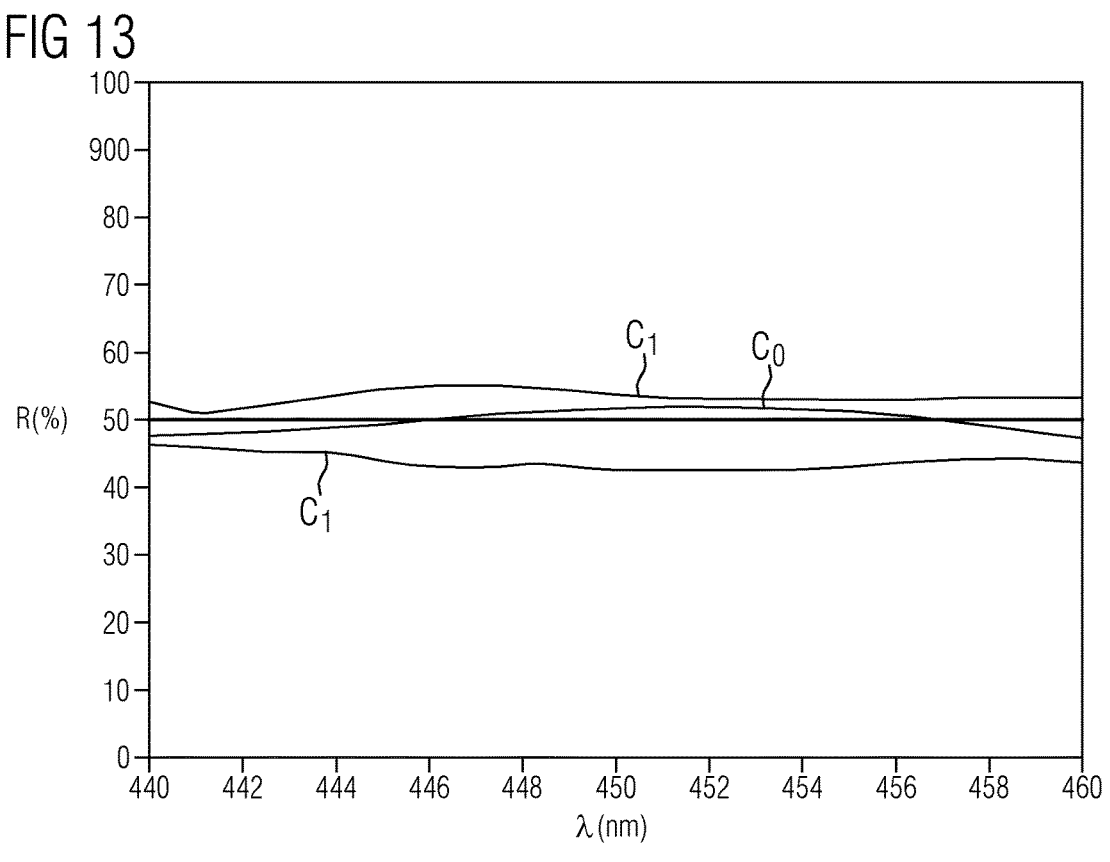
FIGS. 13 to 16 each show simulated values of the reflectivity R as a function of the wavelength 2 of incident electromagnetic radiation for a coating in accordance with one exemplary embodiment.

FIG. 13 shows simulated values of the reflectivity R as a function of the wavelength λ, of incident electromagnetic radiation for a first coating 10 and a second coating 13 each having a multiplicity of individual layers 12, the material, thickness, refractive index and order of which are indicated in table 5.

TABLE 5

| | Material | Thickness (nanometers) | Refractive index n |
|---|---|---|---|
| | Laser | | 2.5 |
| First coating | SiO$_2$ | 70 | 1.5 |
| First coating | TiO$_2$ | 55 | 2.2 |
| First coating | SiO$_2$ | 81 | 1.5 |
| First coating | TiO$_2$ | 62 | 2.2 |
| First coating | SiO$_2$ | 7 | 1.5 |

TABLE 5-continued

| | Material | Thickness (nanometers) | Refractive index n |
|---|---|---|---|
| Cutout | TiO$_2$ | 1000 | 2.2 |
| Second coating | SiO$_2$ | 7 | 1.5 |
| Second coating | TiO$_2$ | 62 | 2.2 |
| Second coating | SiO$_2$ | 81 | 1.5 |
| Second coating | SiO$_2$ | 70 | 1.5 |
| | Laser | | 2.5 |

In this case, the first coating 10 has a symmetry breaking layer 19 composed of TiO$_2$ having a thickness of approximately 55 nanometers.

Figure 14:
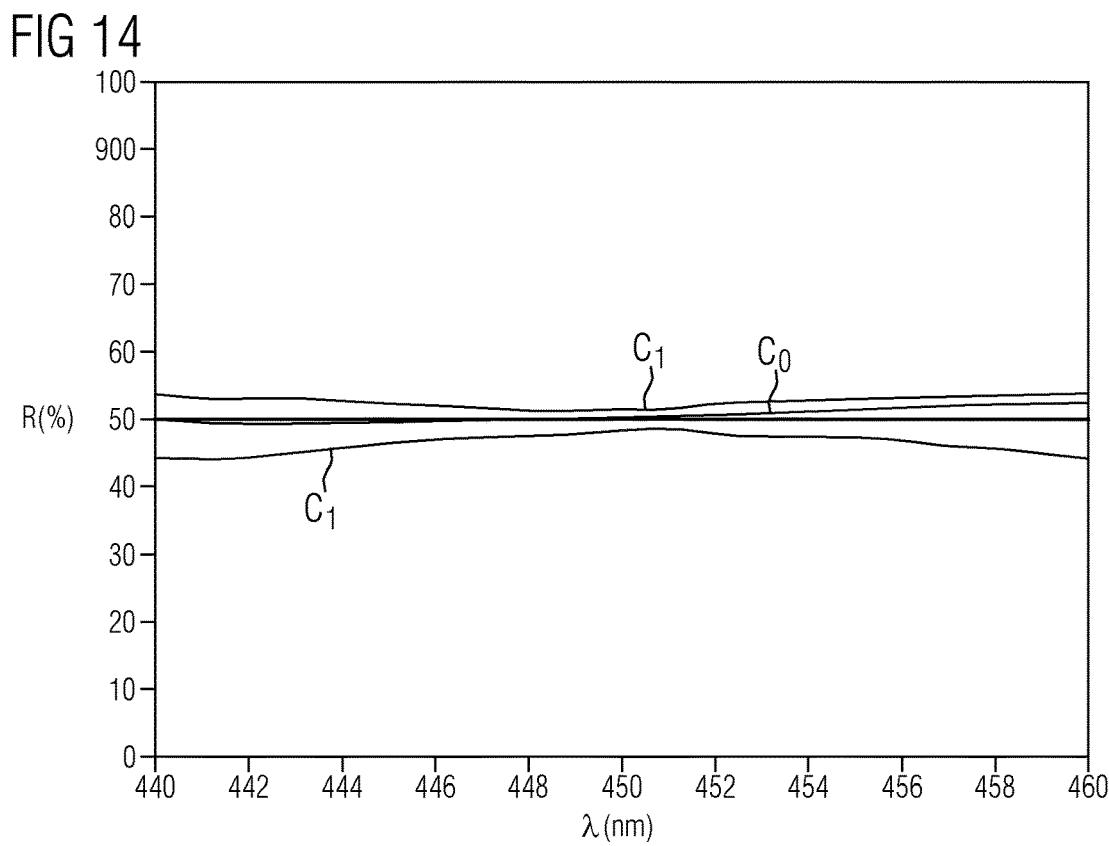

FIG. 14 shows simulated values of the reflectivity R as a function of the wavelength λ, of incident electromagnetic radiation for a first coating 10 and a second coating 13 each having a multiplicity of individual layers 12, the material, thickness, refractive index and order of which are indicated in table 6.

TABLE 6

| | Material | Thickness (nanometers) | Refractive index n |
|---|---|---|---|
| | Laser | | 2.5 |
| First coating | SiO$_2$ | 45 | 1.5 |
| First coating | TiO$_2$ | 89 | 2.2 |
| First coating | SiO$_2$ | 57 | 1.5 |
| First coating | TiO$_2$ | 49 | 2.2 |
| First coating | SiO$_2$ | 45 | 1.5 |
| Cutout | TiO$_2$ | 1000 | 2.2 |
| Second coating | SiO$_2$ | 22.5 | 1.5 |
| Second coating | TiO$_2$ | 24.5 | 2.2 |
| Second coating | SiO$_2$ | 14.2 | 1.5 |
| Second coating | TiO$_2$ | 22.2 | 2.2 |
| Second coating | SiO$_2$ | 11.2 | 1.5 |
| | Laser | | 2.5 |

In this case, the individual layers 12 of the first coating 10 and of the second coating 13 were applied successively in two different steps, wherein the two individual layers 12 of the first coating 10 and of the second coating 13 which directly adjoin the cutout 4 filled with TiO$_2$ and having a thickness of 1000 micrometers each have thicknesses which are in a ratio of 2:1 with respect to one another. The further individual layers 12 of the first coating 10 and the further individual layers 12 of the second coating 13 have thicknesses with a ratio of 4:1 with respect to one another. In this regard, a first coating 10 and a second coating 13 can be produced which have different optical properties but very similar thicknesses. This increases the stability of the coatings 10, 13.

Figure 15:
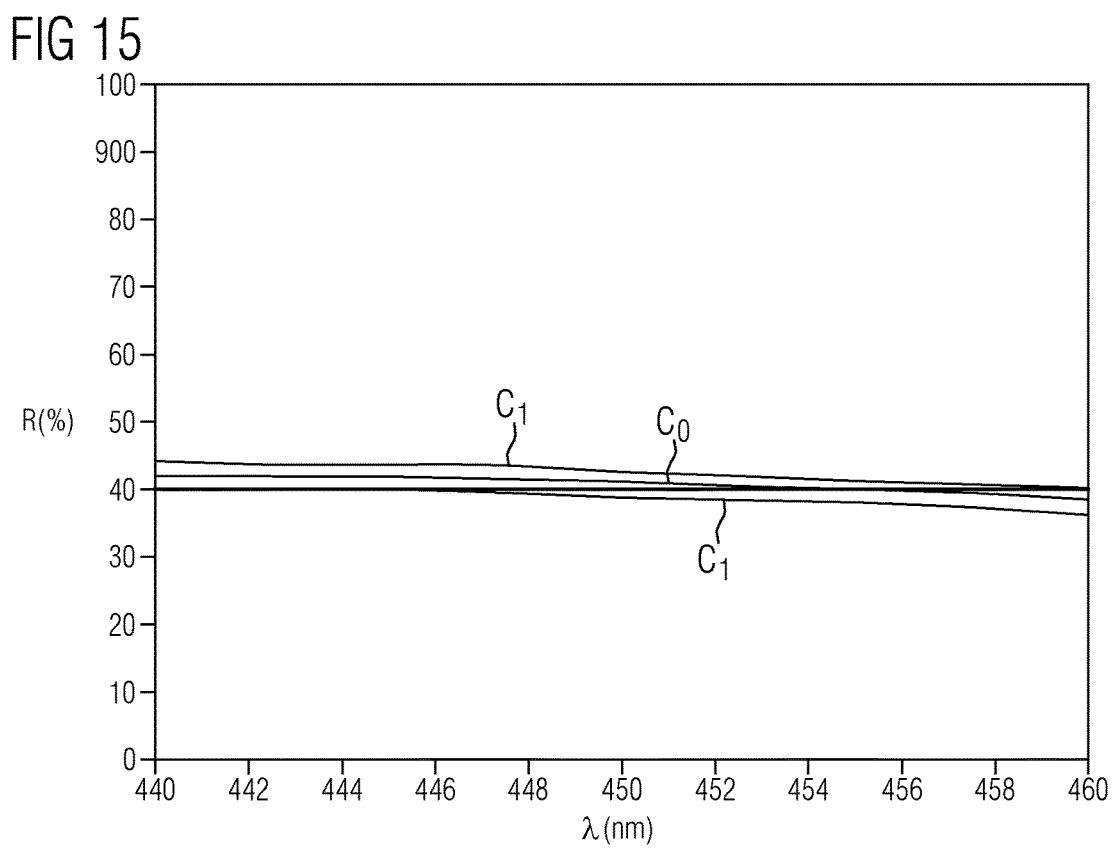

FIG. 15 shows simulated values of the reflectivity R as a function of the wavelength λ, of incident electromagnetic radiation for a first coating 10 and a second coating 13 each having a multiplicity of individual layers 12, the material, thickness, refractive index and order of which are indicated in table 7.

TABLE 7

| | Material | Thickness (nanometers) | Refractive index n |
|---|---|---|---|
| | Laser | | 2.5 |
| First coating | SiO$_2$ | 32 | 1.5 |
| First coating | TiO$_2$ | 160 | 2.2 |
| First coating | SiO$_2$ | 69 | 1.5 |
| First coating | TiO$_2$ | 27.5 | 2.2 |
| First coating | SiO$_2$ | 7.2 | 1.5 |
| First coating | TiO$_2$ | 27.5 | 2.2 |
| Cutout | SiO$_2$ | 1000 | 1.5 |
| Second coating | TiO$_2$ | 110 | 2.2 |
| Second coating | SiO$_2$ | 29 | 1.5 |
| Second coating | TiO$_2$ | 110 | 2.2 |
| Second coating | SiO$_2$ | 17.2 | 1.5 |
| Second coating | TiO$_2$ | 40 | 2.2 |
| Second coating | SiO$_2$ | 8 | 1.5 |
| | Laser | | 2.5 |

In this case, the individual layers 12 of the first coating 10 and of the second coating 13 were applied successively in two different steps, wherein the two individual layers 12 of the first coating 10 and of the second coating 13 which directly adjoin the cutout 4 filled with SiO$_2$ and having a thickness of 1000 micrometers each have thicknesses which are in a ratio of 1:4 with respect to one another. The further individual layers 12 of the first coating 10 and the further individual layers 12 of the second coating 13 have thicknesses with a ratio of 4:1 with respect to one another. In this regard, a first coating 10 and a second coating 13 can be produced which have different optical properties but very similar thicknesses. This increases the stability of the coatings 10, 13.

Figure 16:
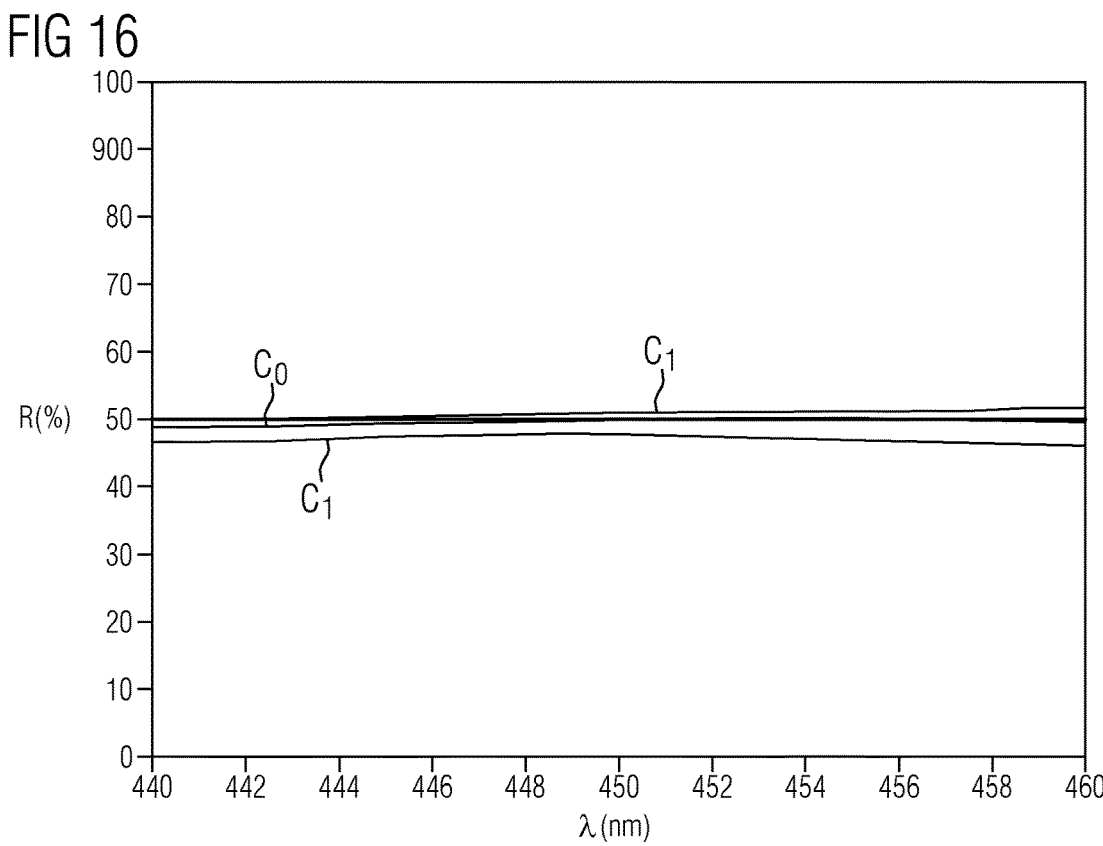

FIG. 16 shows simulated values of the reflectivity R as a function of the wavelength λ, of incident electromagnetic radiation for a first coating 10 and a second coating 13 each having a multiplicity of individual layers 12, the material, thickness, refractive index and order of which are indicated in table 8.

TABLE 8

| | Material | Thickness (nanometers) | Refractive index n |
|---|---|---|---|
| | Laser | | 2.5 |
| First coating | TiO$_2$ | 72 | 2.2 |
| First coating | SiO$_2$ | 8 | 1.5 |
| Cutout | TiO$_2$ | 1000 | 2.2 |
| Second coating | SiO$_2$ | 8 | 1.5 |
| Second coating | TiO$_2$ | 72 | 2.2 |
| Second coating | SiO$_2$ | 84 | 1.5 |
| Second coating | TiO$_2$ | 40 | 2.2 |

TABLE 8-continued

| | Material | Thickness (nanometers) | Refractive index n |
|---|---|---|---|
| Second coating | SiO$_2$ | 89 | 1.5 |
| | Laser | | 2.5 |

In this exemplary embodiment, the first coating 10 and the second coating 13 differ significantly from one another with regard to the number of individual layers 12, thickness and material of the individual layers 12. The first coating can be applied jointly with the last two individual layers of the second coating.

Figure 17:
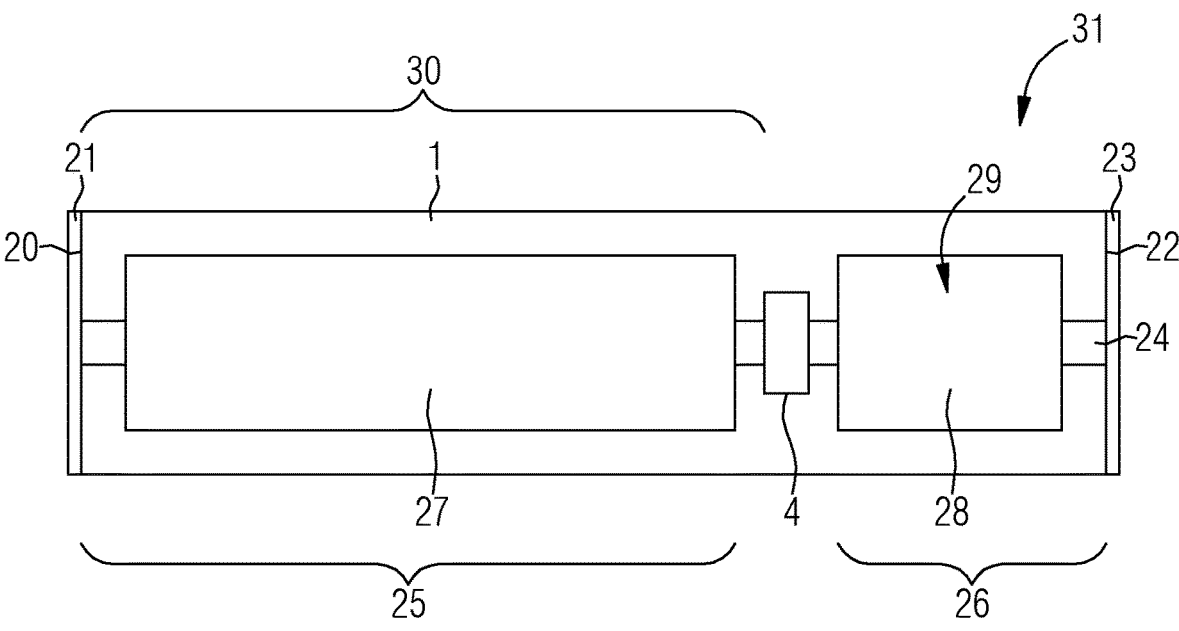
FIGS. 17 to 19 show schematic illustrations of a radiation-emitting semiconductor chip in accordance with one exemplary embodiment.
Figure 18:
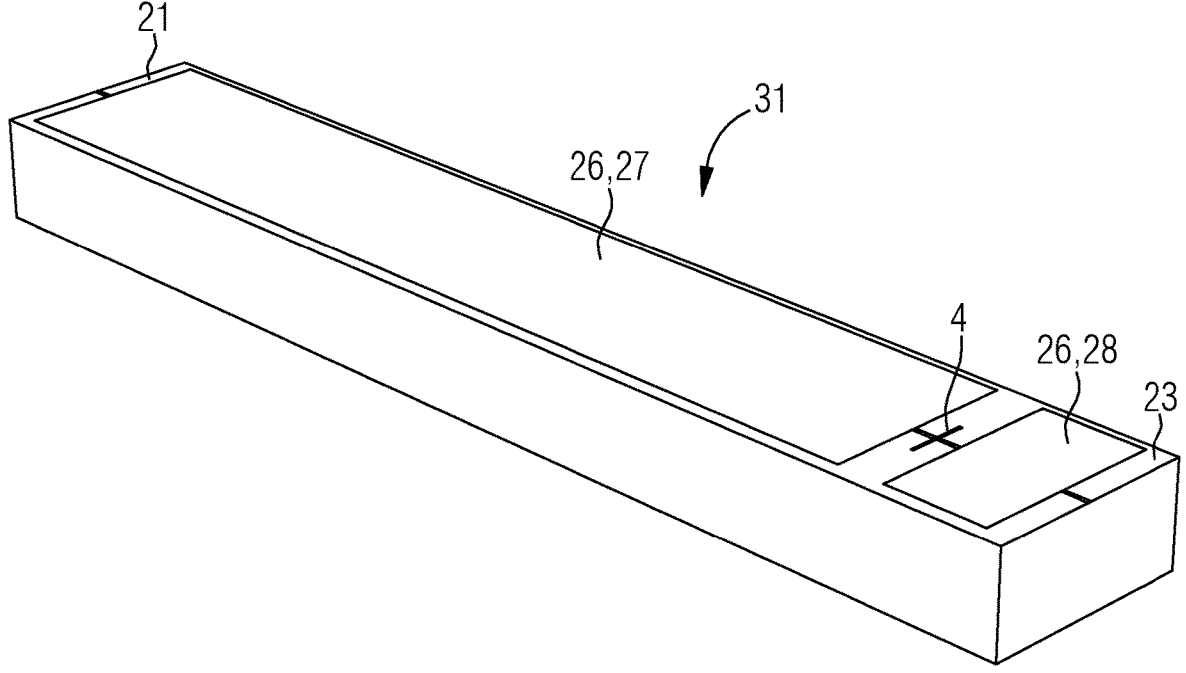
Figure 19:
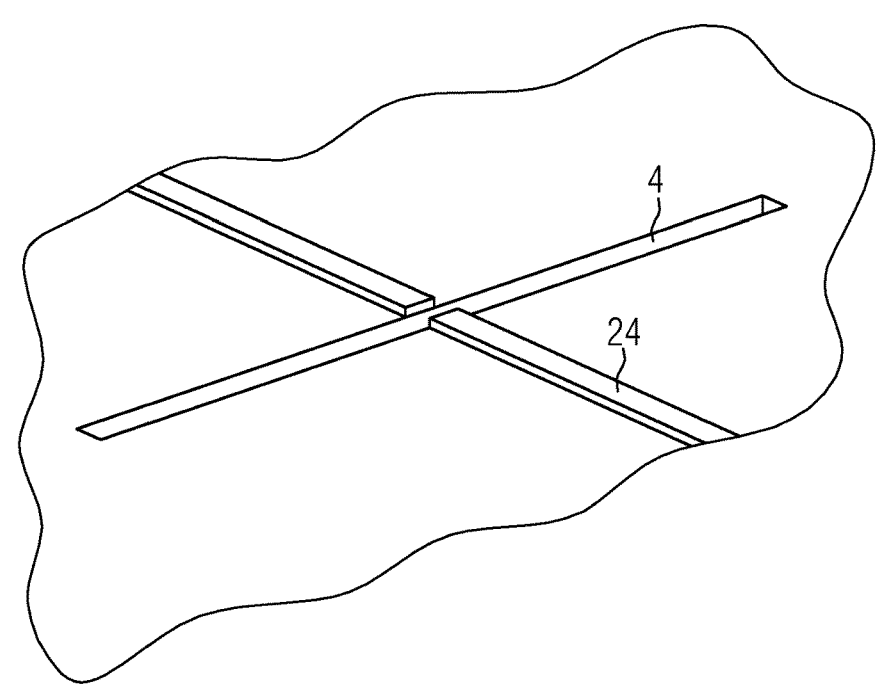

The radiation-emitting semiconductor chip 31 in accordance with the exemplary embodiment in FIGS. 17 to 19 has an active region 2 in which, during operation, electromagnetic radiation is generated. A first layer 21 is applied on a side surface 20 of the semiconductor body 1, said first layer being embodied as highly reflective for electromagnetic radiation of the active region 2. A second layer 23 is applied on a side surface 22 of the semiconductor body 1 that is opposite said side surface 21, said second layer being embodied as antireflective for the electromagnetic radiation of the active region 2 (FIGS. 17 and 18). Furthermore, the semiconductor body 1 comprises a ridge waveguide 24 extending from one side surface 20 of the semiconductor body 1 to the opposite side surface 22 of the semiconductor body 1.

Furthermore, the semiconductor body 1 has a first segment 25 and a second segment 26, which are separated from one another by a cutout 4. The cutout 4 is illustrated in detail in FIG. 19. In the present case, the cutout 4 completely perforates the ridge waveguide 24. One of the side surfaces 6, 7 of the cutout 4 is provided with a first coating 10 embodied as antireflective or highly reflective for the electromagnetic radiation of the active region 2. By way of example, the first coating 10 on a first side surface 6 of the cutout 4 is embodied as antireflective. In this case, the second coating 13 on the second side surface 7 opposite the first side surface 6 is embodied as highly reflective for the electromagnetic radiation of the active region 2.

A first electrical contact location 27 is arranged in the region of the first segment 25 and is suitable for electrically contacting the first segment 25 and driving it separately from the second segment 26. A second contact location 28 is arranged on the second segment 26 and is suitable for electrically driving the second segment 26. The first electrical contact location 27 and the second electrical contact location 28 each cover the ridge waveguide 24.

In the present case, the first segment 25 and the second segment 26 have different functionalities. The first segment 25 is configured to generate electromagnetic laser radiation, while the second segment 26 is a modulation element 29 for the electromagnetic laser radiation.

The highly reflective second coating 13, together with the highly reflective first layer 21 on the side surface 20 of the semiconductor body 1, forms a resonator 30 in which the active region 2 is arranged within the first segment 25. The resonator is designed to generate a population inversion within the active region 2, such that electromagnetic laser radiation is attained within the first segment 25 of the semiconductor body 1.

In the present case, the second segment 26 comprises the modulation element 29. The modulation element 29 can be embodied as partly or wholly absorbent for the electromagnetic laser radiation generated in the first segment 25 during operation by means of corresponding energization via the second electrical contact location 28.

The electromagnetic laser radiation generated in the first segment 25 enters the modulation element 29 partly through the highly reflective first coating 10, in which modulation element an intensity of the laser radiation can be modulated. The modulated electromagnetic laser radiation then exits the radiation-emitting semiconductor chip 31 from the side surface 22 of the semiconductor body 1 having the antireflective second layer 23 (FIG. 18).

FIGS. 20 to 25 show simulated values of reflectivities R as a function of the wavelength λ for various cutouts 4 that are not provided with a coating 10, 13 but rather are only filled with air.

Figure 20:
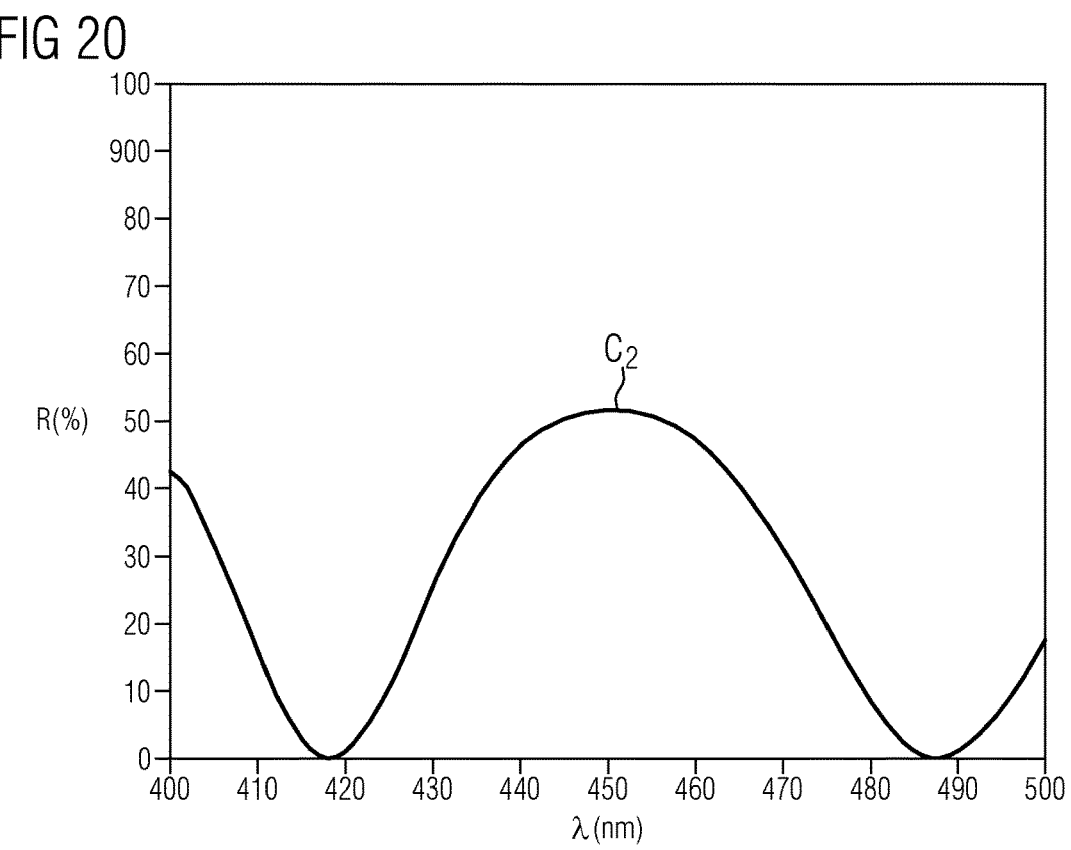
FIGS. 20 to 25 each show simulated values of the reflectivity R as a function of the wavelength 2 of incident electromagnetic radiation on an uncoated side surface of a cutout.

FIG. 20 shows reflectivities R as a function of the wavelength λ for an air-filled cutout 4 having a width of approximately 1462.5 nanometers. In this case, a maximum of the reflectivity R having a value of approximately 52% is at approximately 450 nanometers (curve C2).

Figure 21:
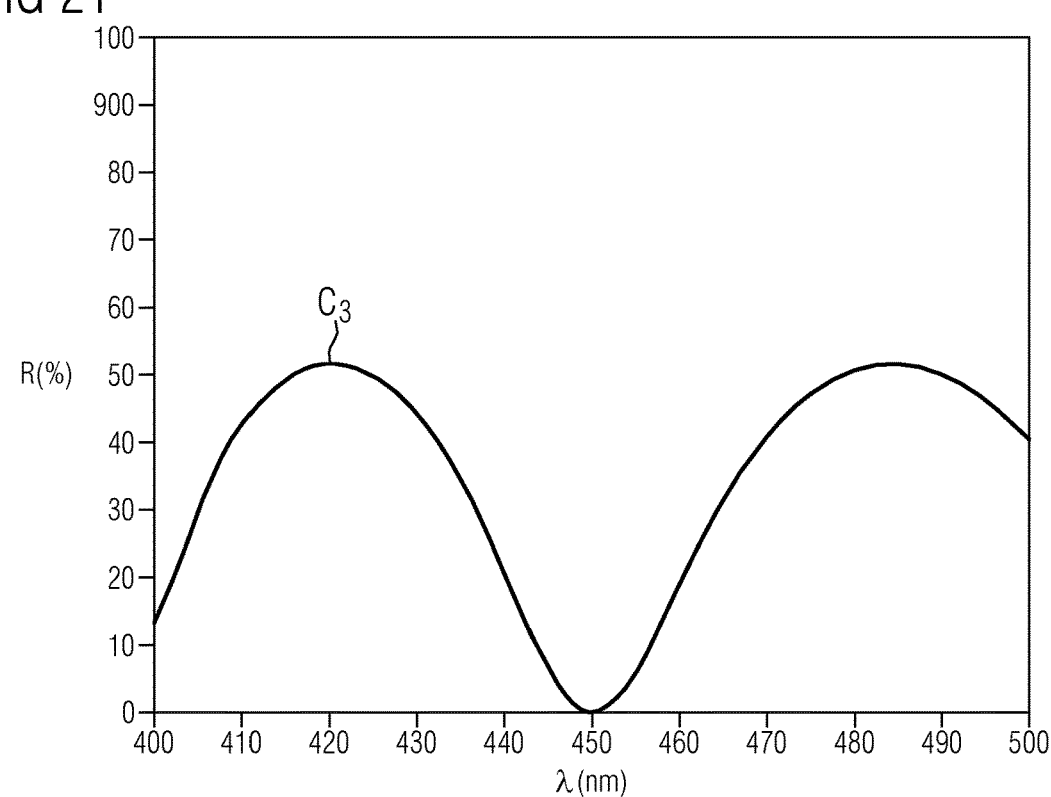

By contrast, FIG. 21 shows the reflectivity R for an only insignificantly wider air-filled cutout 4 having a width of 1575 nanometers. A minimum for the reflectivity R is now present at a wavelength λ of approximately 450 nanometers (curve C3).

Figure 22:
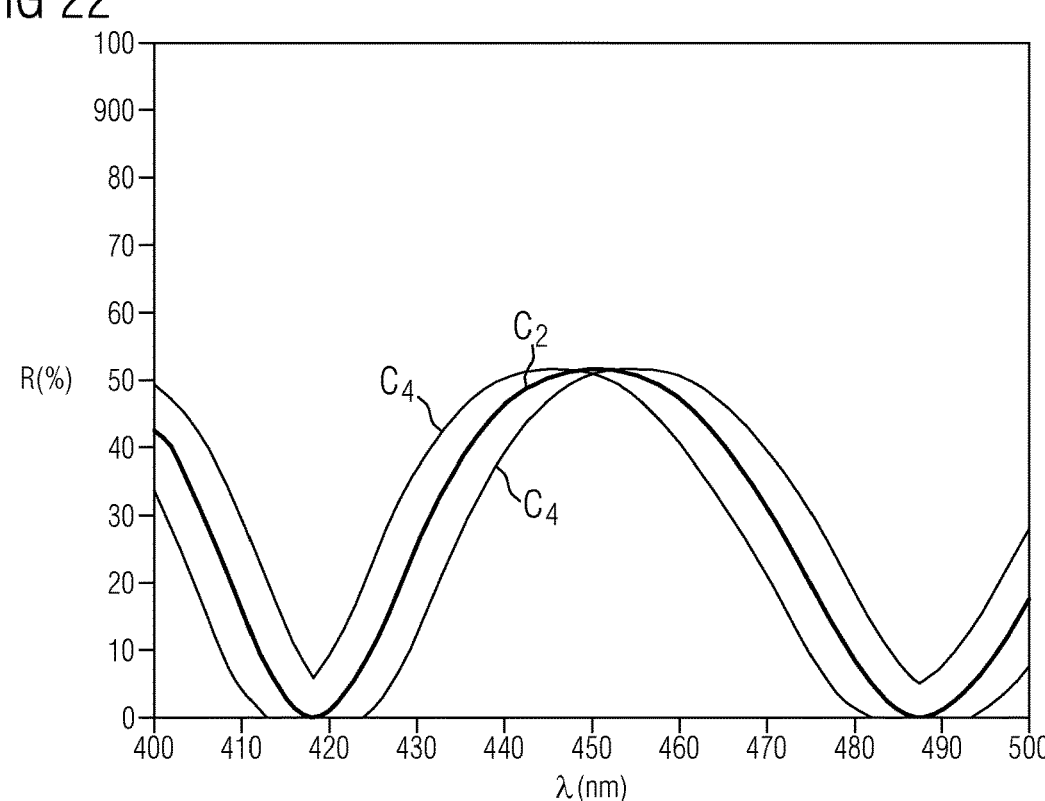

FIG. 22 shows the reflectivity R as a function of the wavelength λ in the case of a variation of 1% of a width of an air-filled cutout 4 proceeding from a value of the width of approximately 1462.5 nanometers (curves C4). Furthermore, the reflectivity C2 from FIG. 20 is plotted as reference.

Figure 23:
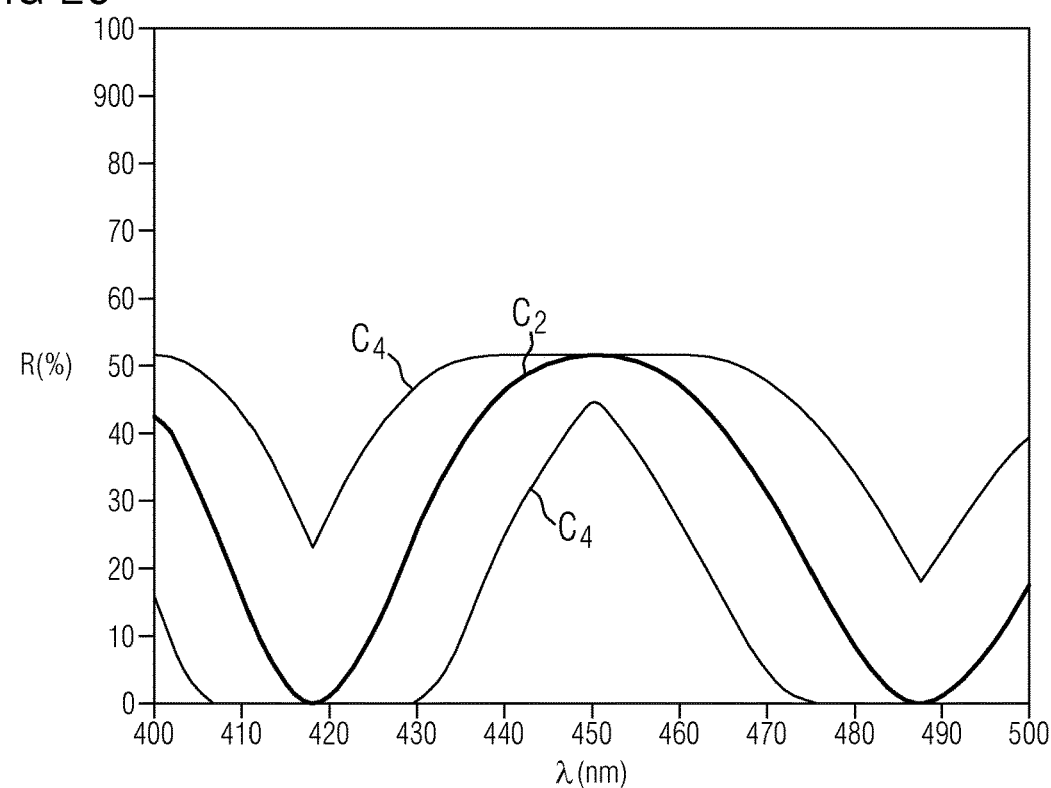

FIG. 23 shows the reflectivity R as a function of the wavelength λ in the case of a variation of 2.5% of a width of an air-filled cutout proceeding from a value of the width of approximately 1462.5 nanometers (curve C4). Furthermore, the reflectivity C2 from FIG. 20 is plotted as reference.

Figure 24:
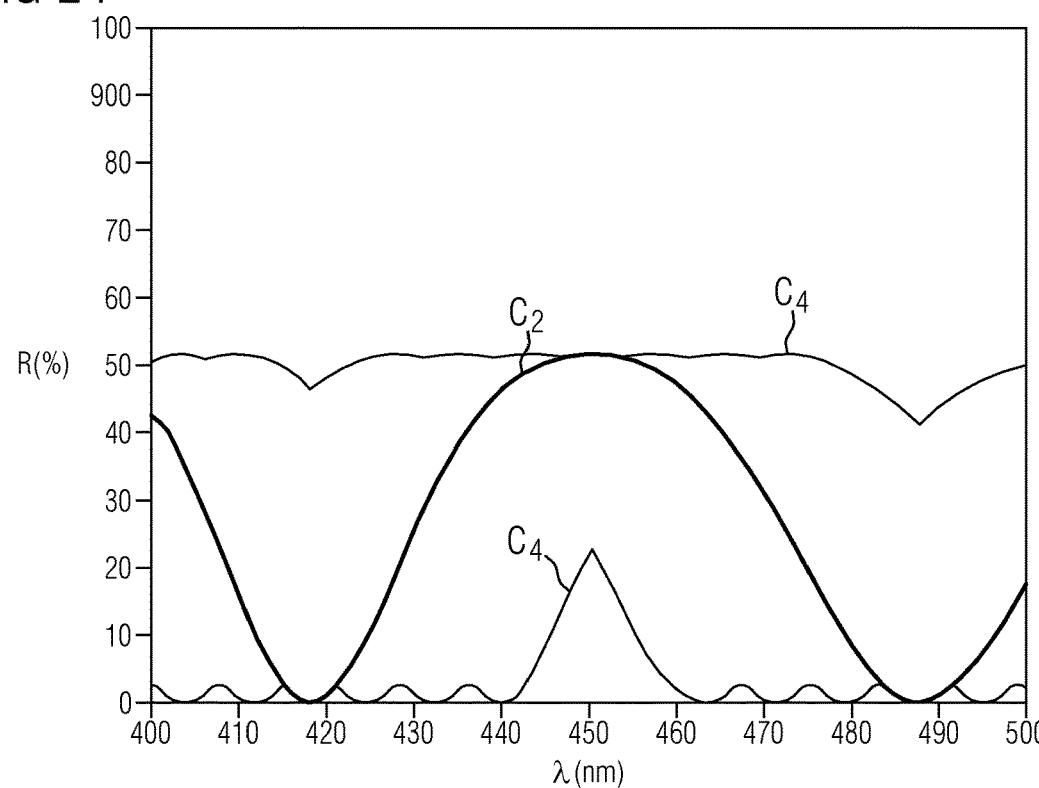

FIG. 24 shows the reflectivity R as a function of the wavelength λ in the case of a variation of 5% of a width of an air-filled cutout proceeding from a value of the width of approximately 1462.5 nanometers (curve C4). Furthermore, the reflectivity C2 from FIG. 20 is plotted as reference.

Figures 25, 26:
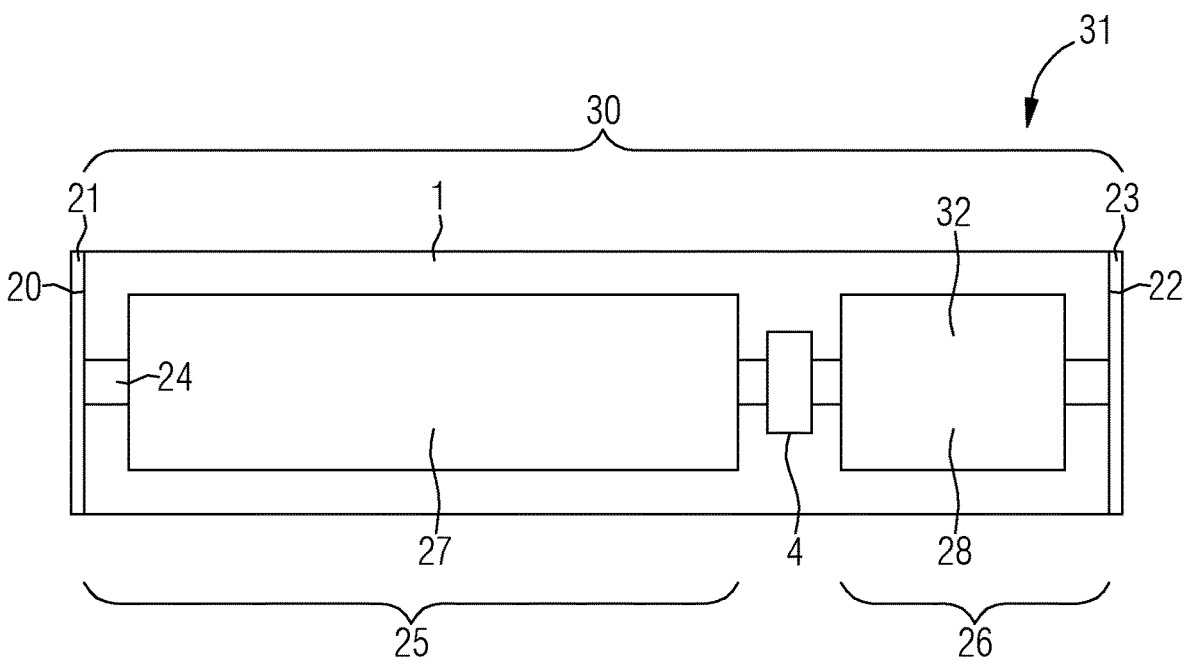
FIGS. 26 to 30 show schematic plan views of a radiation-emitting semiconductor chip in accordance with various exemplary embodiments.

FIG. 25 shows the reflectivity R as a function of the wavelength λ in the case of a variation of 10% of a width of an air-filled cutout proceeding from a value of the width of approximately 1462.5 nanometers (curve C4). Furthermore, the reflectivity C2 from FIG. 20 is plotted as reference.

As shown by FIGS. 20 to 25, the reflectivity of uncoated side surfaces of a cutout varies greatly with the dimensions of the cutout such as may arise as a result of manufacturing tolerances, for example. A comparison with FIGS. 6, 7, 9, 10, 13, 14, 15, 16, 38, 39 shows that this problem can be at least significantly reduced with the first coating and/or the second coating.

In contrast to the radiation-emitting semiconductor chip 31 in accordance with the exemplary embodiment in FIGS. 17 to 19, the radiation-emitting semiconductor chip 31 in accordance with the exemplary embodiment in FIG. 26 has a switching element 32 instead of a modulation element 29 within the second segment 26. The switching element 32 is suitable for switching the radiation-emitting semiconductor chip 31 on and off. Furthermore, a first side surface 6 of the cutout 4 is provided with a first coating and a second side surface 7 of the cutout 4 is provided with a second coating 13, the first coating 10 and the second coating 13 reflecting as little as possible of the electromagnetic laser radiation generated in the first segment 25. In the present exemplary embodiment, the cutout 4 isolates the first segment 25 from the second segment 26 only electrically and not optically.

Furthermore, in the case of the present radiation-emitting semiconductor chip 31, a second layer 23 on a second side surface 22 of the semiconductor body 1 is embodied as reflective for the electromagnetic laser radiation in order, together with a first highly reflective layer 21 on the opposite side surface 20 of the semiconductor body 1, to form a resonator 30 for electromagnetic laser radiation of an active region 2 of the semiconductor body 1.

Figure 27:
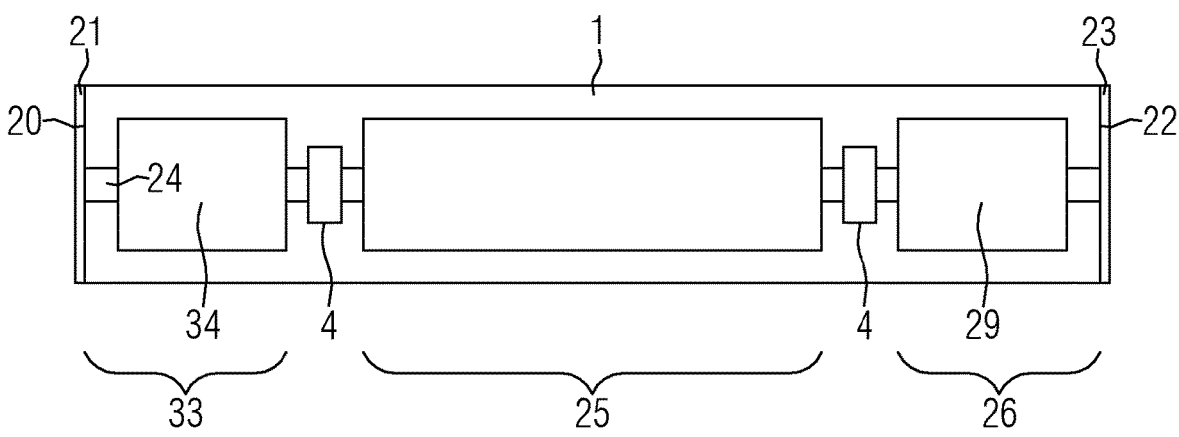

In contrast to the radiation-emitting semiconductor chip 31 in accordance with the exemplary embodiment in FIGS. 17 to 19, the semiconductor chip 31 in accordance with the exemplary embodiment in FIG. 27 comprises a third segment 33 having a photodiode 34. In this case, a further cutout 4 is arranged between the third segment 33 having the photodiode 34 and the first segment 25, in which electromagnetic laser radiation is generated during operation.

Figure 28:
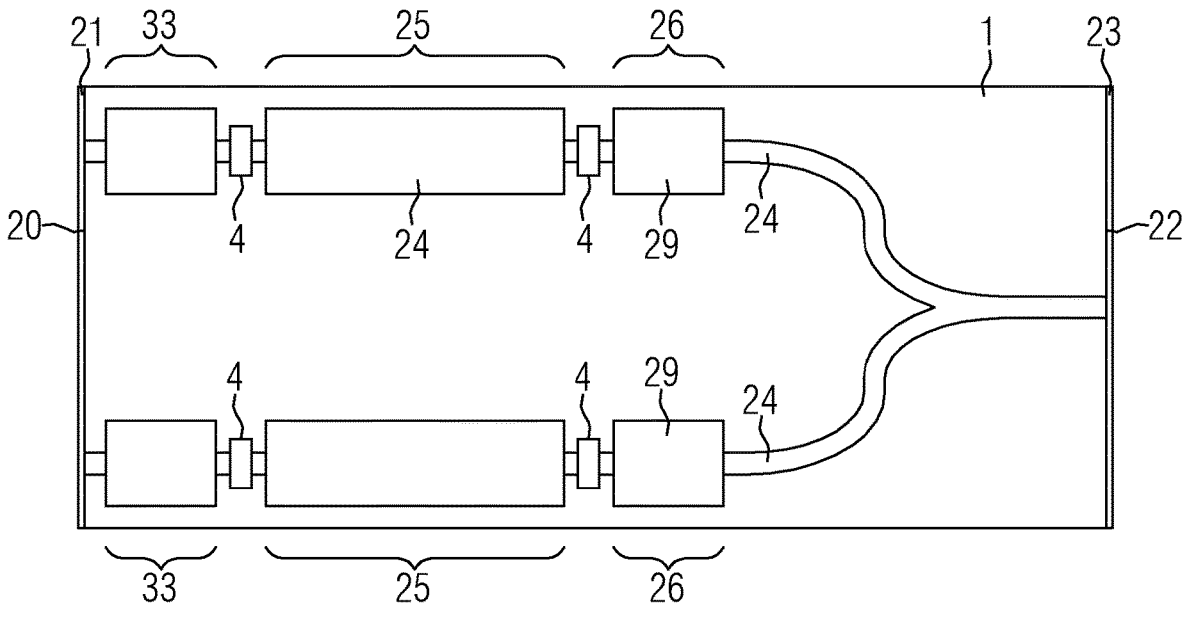

The radiation-emitting semiconductor chip 31 in accordance with the exemplary embodiment in FIG. 28 has a semiconductor body 1 having a total of six segments 25, 26, 33, three of which in each case are embodied as already described with reference to FIG. 27. Furthermore, the semiconductor body 1 has two ridge waveguides 24, each of which passes through three segments 25, 26, 33. The two ridge waveguides 24 merge into one common ridge waveguide 24 downstream of both modulation elements 29.

Figure 29:
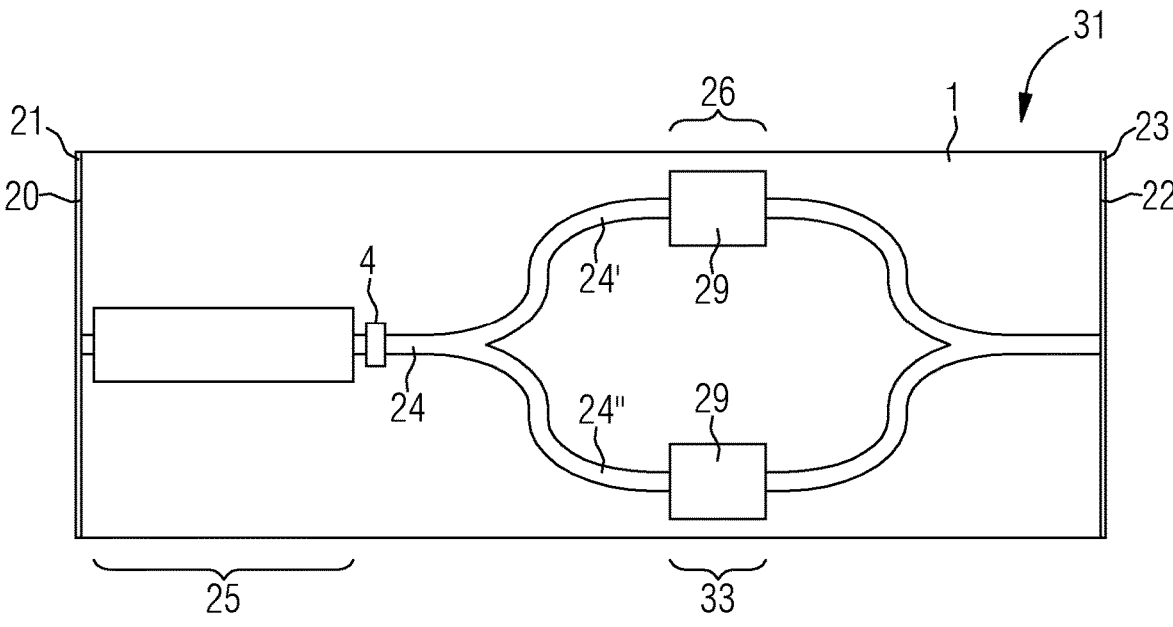

The radiation-emitting semiconductor chip 31 in accordance with the exemplary embodiment in FIG. 29 has a first segment 25, in which electromagnetic laser radiation is generated. A cutout 4 is arranged laterally with respect to the first segment 25, in the case of which cutout two opposite side surfaces 6, 7 are provided with a first coating 10 and a second coating 13, as already described here. Furthermore, the radiation-emitting semiconductor chip 31 in accordance with the exemplary embodiment in FIG. 29 comprises a ridge waveguide 24, which passes completely through the first segment 25 and splits into two branches 24', 24" downstream of the cutout 4.

Furthermore, the radiation-emitting semiconductor chip 31 comprises two further segments 26, 33, each embodied as a modulation element 29. In the present case, the modulation elements 29 are a Mach-Zehnder interferometer having an adjustable phase shift. One of the branches 24', 24" of the ridge waveguide 24 passes through each modulation element 29. The two branches 24', 24" of the ridge waveguide 24 merge again downstream of the two segments 26, 33 comprising the modulation elements 29. The ridge waveguide 24 guides the electromagnetic laser radiation generated in the first segment 25 during operation through the two modulation elements 29 and then to a side surface 22 of the semiconductor body 1, from which the laser radiation is emitted.

Figure 30:
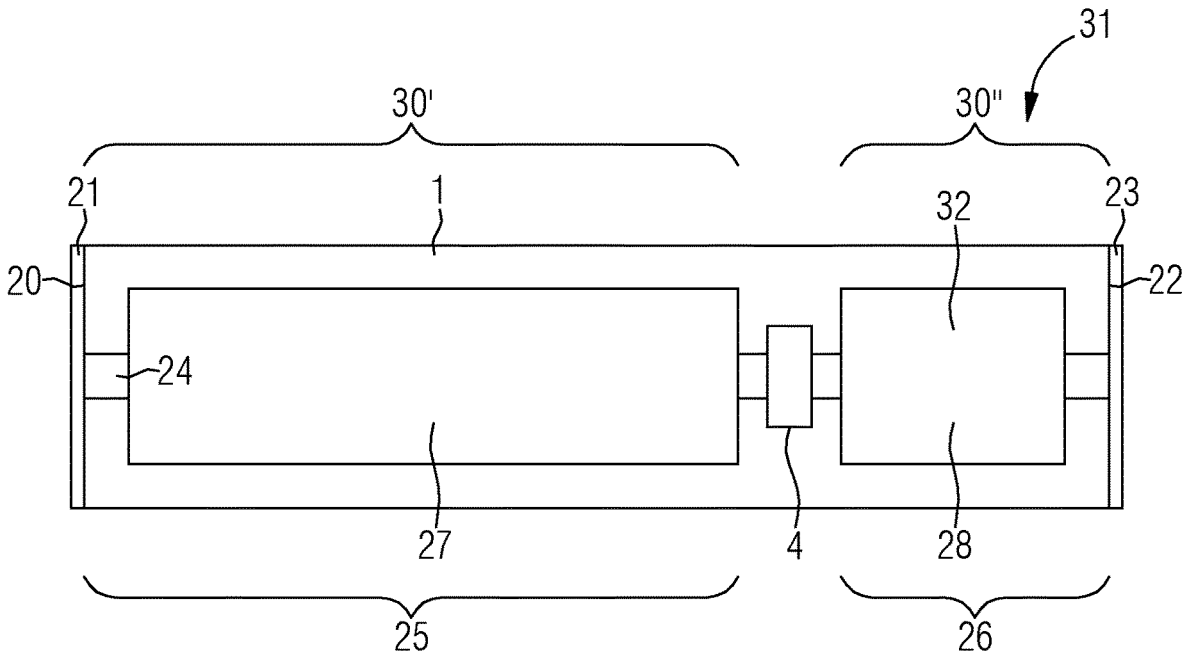

The radiation-emitting semiconductor chip 31 in accordance with the exemplary embodiment in FIG. 30 has a first segment 25 and a second segment 26. The first segment 25 and the second segment 26 are provided for generating electromagnetic laser radiation. A cutout 4 having a first side surface 6 and a second side surface 7 opposite the first side surface 6 is arranged between the first segment 25 and the second segment 26.

The first side surface 6 of the cutout 4 is provided with a first coating 10 and the second side surface 7 is provided with a second coating 13. The first coating 10, together with a first layer 21 on a side surface 20 of the semiconductor body 1, forms a first resonator 30' for the electromagnetic radiation generated in an active region 2 within the first segment 25. The second coating 10, together with a second layer 23 on a further side surface 22 of the semiconductor body 1, forms a second resonator 30" for the electromagnetic radiation generated in the active region 2 within the second segment 26. Consequently, electromagnetic laser radiation is generated in both segments 25, 26.

The semiconductor body 1 furthermore comprises a ridge waveguide 24 passing through the semiconductor body 1 from one side surface to the opposite side surface 22. In particular, the ridge waveguide 24 passes through the first segment 25 and the second segment 26 and guides electromagnetic laser radiation between the two side surfaces 20, 22 of the semiconductor body 1. The first resonator 30' and the second resonator 30" have different lengths, such that electromagnetic laser radiation of different modes arises in the two resonators 30', 30". The first resonator 30' and the second resonator 30" are optically coupled to one another. As a result, modes of electromagnetic laser radiation which exist for both resonators 30', 30" form in the entire ridge waveguide 24. In this regard, it is possible to generate electromagnetic laser radiation having only few modes, ideally only one mode, with a very small line width and little temperature dependence.

Figure 31:
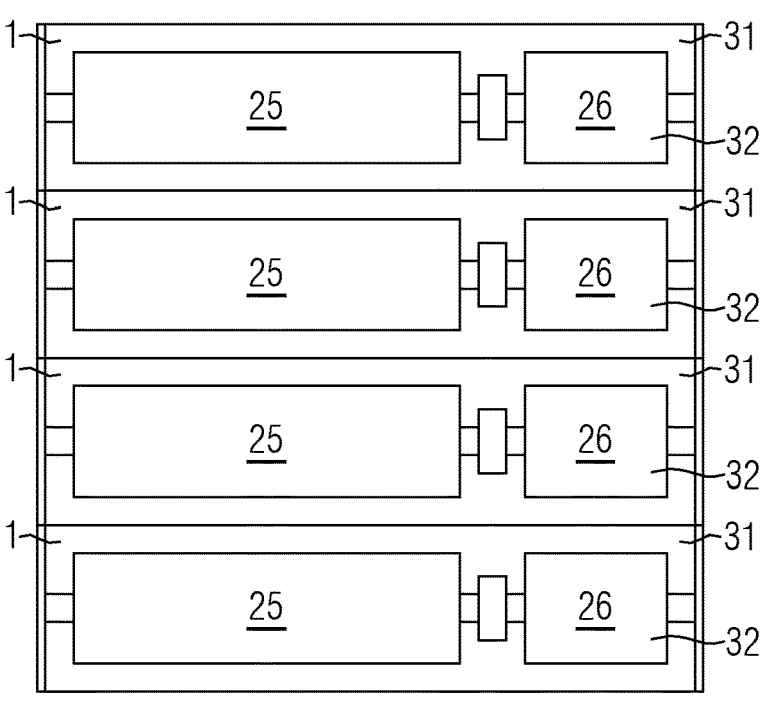
FIGS. 31 to 34 show schematic plan views of an array in accordance with various exemplary embodiments.

The array in accordance with the exemplary embodiment in FIG. 31 comprises four radiation-emitting semiconductor chips 31, which are embodied integrally with one another, that is to say are fabricated jointly from one wafer. Each semiconductor chip 31 of the array in accordance with the exemplary embodiment in FIG. 31 has a semiconductor body 1 comprising two segments 25, 26 having different functions, between which a respective cutout 4 is arranged.

Each semiconductor body 1 has a first segment 25, in which laser radiation is generated, and a second segment 26 embodied as a switching element 32. Opposite side surfaces 6, 7 of each cutout 4 are provided with coatings 10, 13, as already described. In particular, the coatings 10, 13 of the cutouts 4 of the different semiconductor bodies 1 are different. In this regard, the laser radiation emitted by the array can be adjusted in a desired manner.

Figure 32:
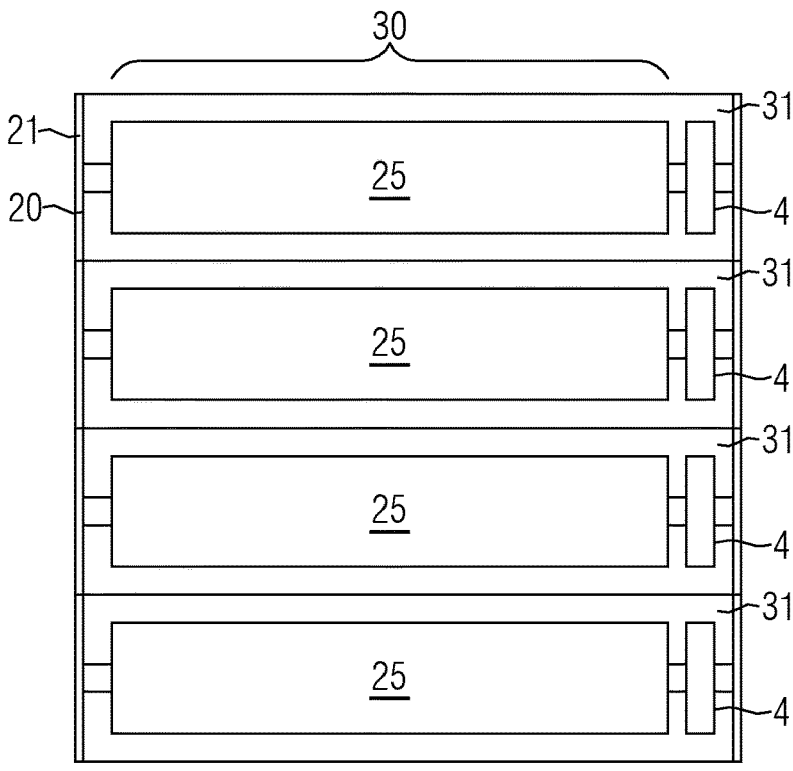

In contrast to the array in accordance with the exemplary embodiment in FIG. 31, the array in accordance with the exemplary embodiment in FIG. 32 has radiation-emitting semiconductor chips 31 having semiconductor bodies 1 comprising only a single segment 25. In the present case, the different segments 25 of the various semiconductor bodies 1 are provided for generating electromagnetic laser radiation of different wavelengths. One of the coatings 10, 13 of the side surfaces 6, 7 of the cutouts 4 in each case forms a resonator 30 having a first layer 21 on a side surface 20 of the semiconductor body 1, such that the semiconductor chips 31 emit different laser radiation in a targeted manner. The use of a plurality of radiation-emitting semiconductor chips 31 in an array thus makes it possible to set different laser properties in a targeted manner. Additionally or alternatively, it is also possible to compensate for differences in the laser radiation of the semiconductor chips 31 which arise for example as a result of different thermal coupling during the mounting of an array.

Figure 33:
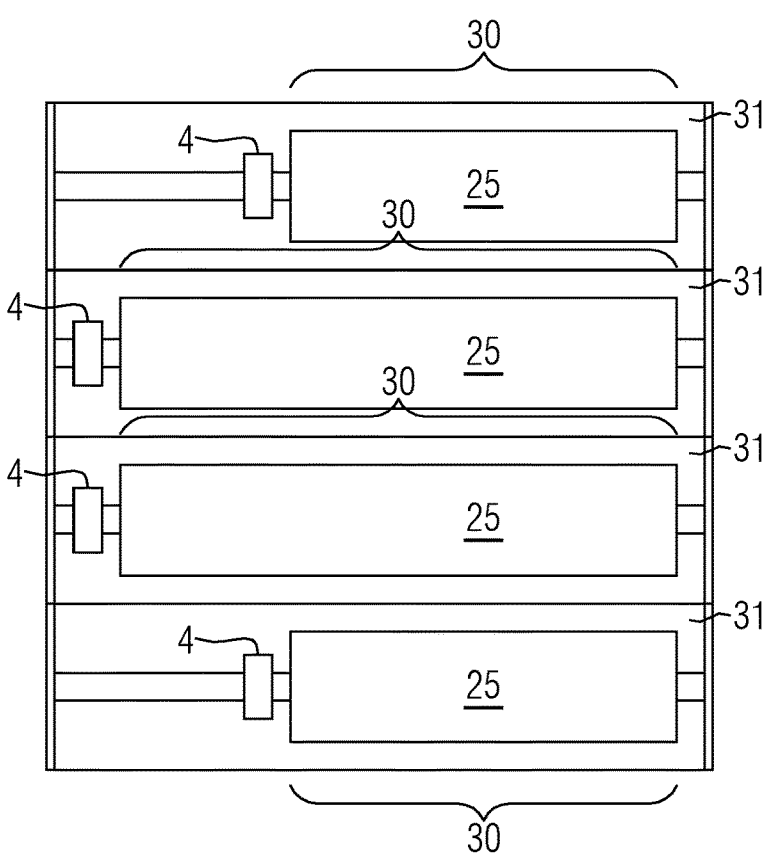
Figure 34:
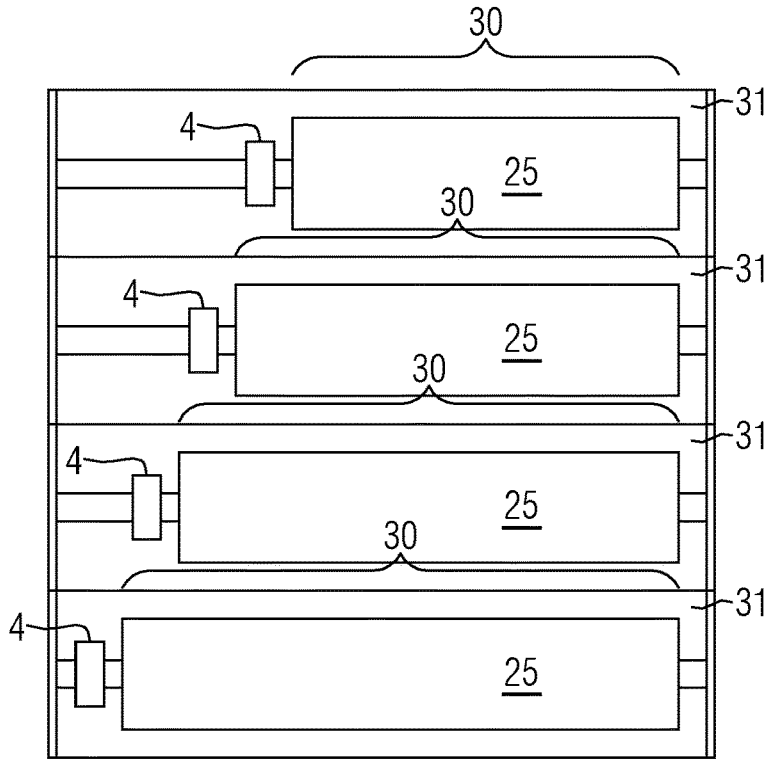

The arrays in accordance with the exemplary embodiments in FIGS. 33 and 34 likewise have radiation-emitting semiconductor chips 31 comprising only a single segment 25. In this case, the resonators 30 of the individual radiation-emitting semiconductor chips 31 differ in their lengths.

Figure 35:
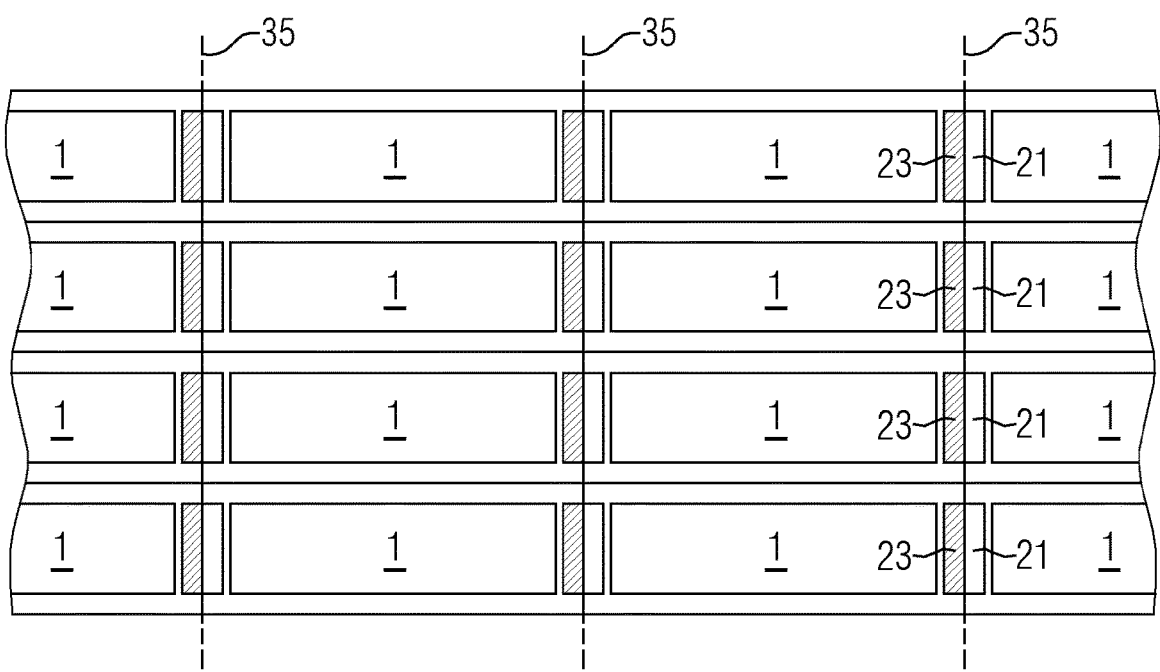
FIGS. 35 to 37 show schematic illustrations of different stages of a method in accordance with one exemplary embodiment.
Figure 36:
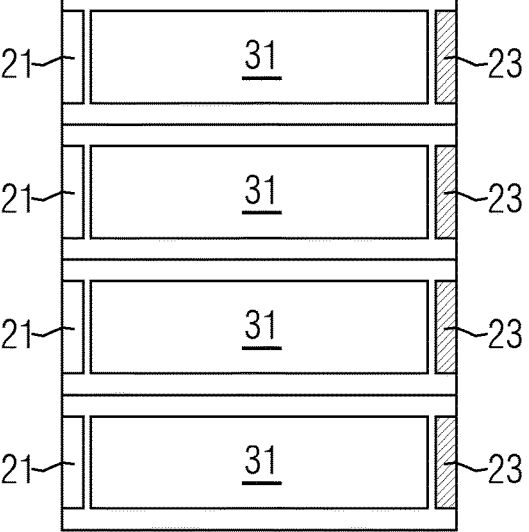
Figure 37:
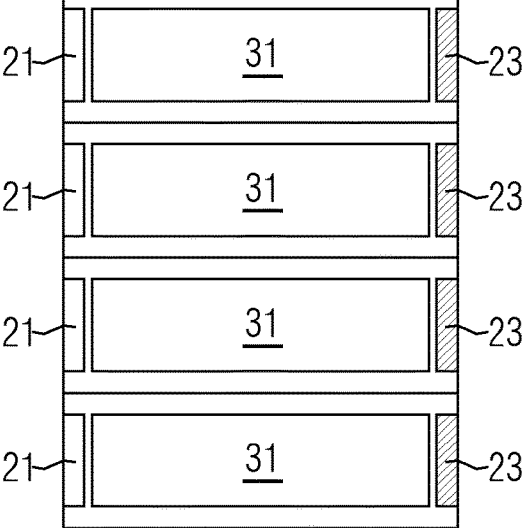

In the methods in accordance with the exemplary embodiment in FIGS. 35 to 37, firstly a multiplicity of semiconductor bodies 1 are provided in a wafer assemblage. Separating trenches 35 are then arranged between the semiconductor bodies 1 (FIG. 35). By way of example, the separating trenches 35 can be produced by etching. A layer sequence comprising a first layer 21 and a second layer 23 is then deposited in the separating trenches 35. In this case, the first layer 21 is embodied as highly reflective for laser radiation generated in an active region 2 of the semiconductor body 1, while the second layer 32 is embodied as antireflective for the laser radiation.

Finally, the semiconductor bodies 1 are singulated along the separating trenches 35 in such a way that the first layer 21 is arranged on a side surface 20 of one semiconductor body and the second layer 23 is arranged on a side surface 22 of a directly adjacent semiconductor body 1. In this case, the separating trenches 35 are arranged in such a way that a plurality of semiconductor chips 31 comprising a semiconductor body 1 having a first layer 21 and/or second layer 23 are combined to form an array (FIGS. 36 and 37). These arrays can also furthermore be singulated to form individual semiconductor chips.

Figure 38:
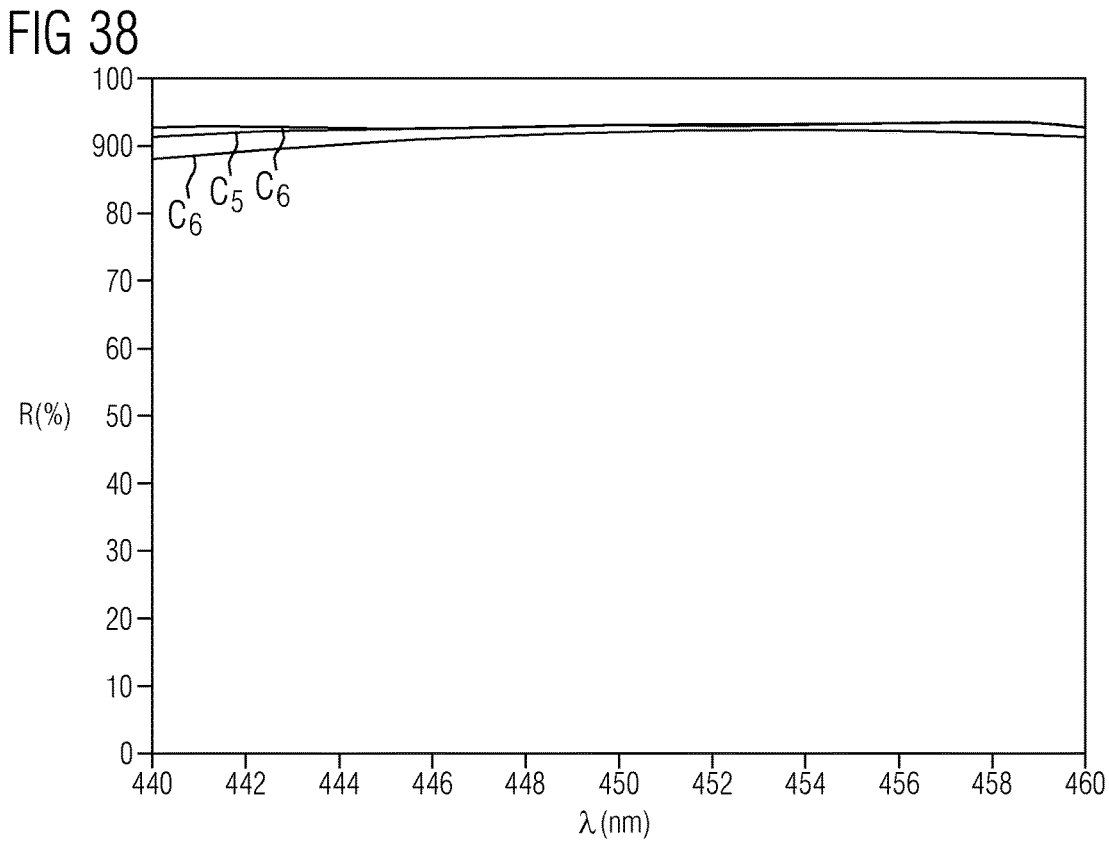
FIGS. 38 and 39 show simulated values of the reflectivity R as a function of the wavelength 2 of incident electromagnetic radiation for a coating in accordance with one exemplary embodiment.
Figure 39:
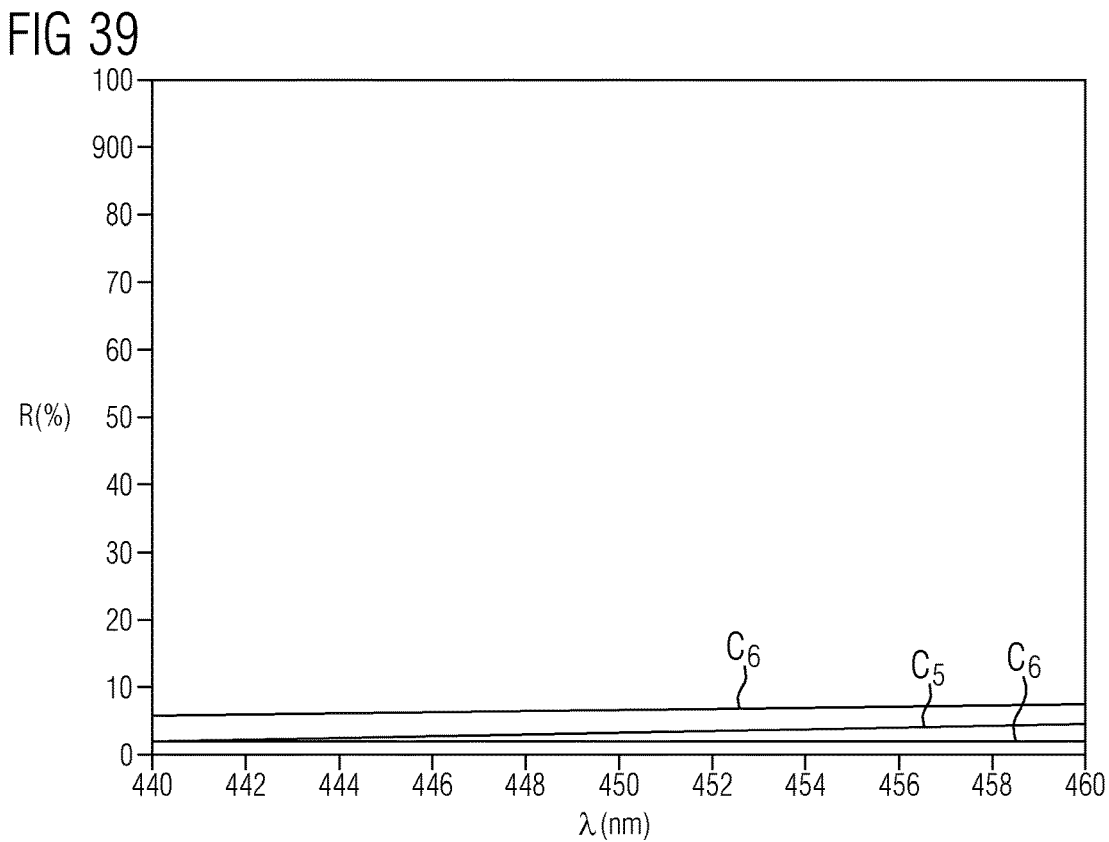

FIGS. 38 and 39 show simulated values of the reflectivity R as a function of the wavelength λ of incident electromagnetic radiation for a first layer 21 and a second layer 23 each having a multiplicity of individual layers 21, the material, thickness, refractive index and order of which are indicated in table 9. The curve C5 in FIG. 38 here shows the reflectivity of the first layer 21, while the curve C6 represents the reflectivity in the case of variation of the thickness of the layer 21 by 2% (at least 2 nanometers). The curve C5 in FIG. 39 here shows the reflectivity of the second layer 23, while the curve C6 represents the reflectivity in the case of variation of the thickness of the layer 23 by 2% (at least 2 nanometers).

TABLE 9

| | Material | Thickness (nanometers) | Refractive index n |
|---|---|---|---|
| | Laser | | 2.5 |
| First layer | SiO₂ | 80 | 1.5 |
| First layer | TiO₂ | 46 | 2.2 |
| First layer | SiO₂ | 231 | 1.5 |
| First layer | TiO₂ | 51 | 2.2 |
| First layer | SiO₂ | 76 | 1.5 |
| First layer | TiO₂ | 154 | 2.2 |
| First layer | SiO₂ | 77 | 1.5 |
| First layer | TiO₂ | 51 | 2.2 |
| Separating trench | Air | 1000 | 1 |
| Second layer | TiO₂ | 18.9 | 2.2 |
| Second layer | SiO₂ | 28.5 | 1.5 |
| Second layer | TiO₂ | 57 | 2.2 |
| Second layer | SiO₂ | 28.1 | 1.5 |
| Second layer | TiO₂ | 18.9 | 2.2 |
| Second layer | SiO₂ | 85.5 | 1.5 |
| Second layer | TiO₂ | 17 | 2.2 |
| Second layer | SiO₂ | 29.6 | 1.5 |
| | Laser | | 2.5 |

In this exemplary embodiment, in a first step, the individual layers 21 of the first layer 21 and of the second layer 23 are deposited on separating trenches 35 between semiconductor bodies 1 which are embodied in continuous fashion in a wafer assemblage. The wafer assemblage is then singulated along the separating trenches 35, such that the first layer 21 is arranged on a side surface 20 of one semiconductor body and the second layer 23 is arranged on the side surface 22 of a directly adjacent semiconductor body 1. In this case, the first layer 21 is embodied as antireflective for the electromagnetic radiation generated in an active region 2 of the semiconductor body 1, while the second layer 23 is embodied as highly reflective for the electromagnetic radiation generated in the active region 2 of the semiconductor body 1 or has a defined reflectivity for the electromagnetic radiation generated in the active region 2 of the semiconductor body 1. In this case, a ratio of a thickness of the first layer 21 to a thickness of the second layer 23 is approximately 2.7:1.

Figure 40:
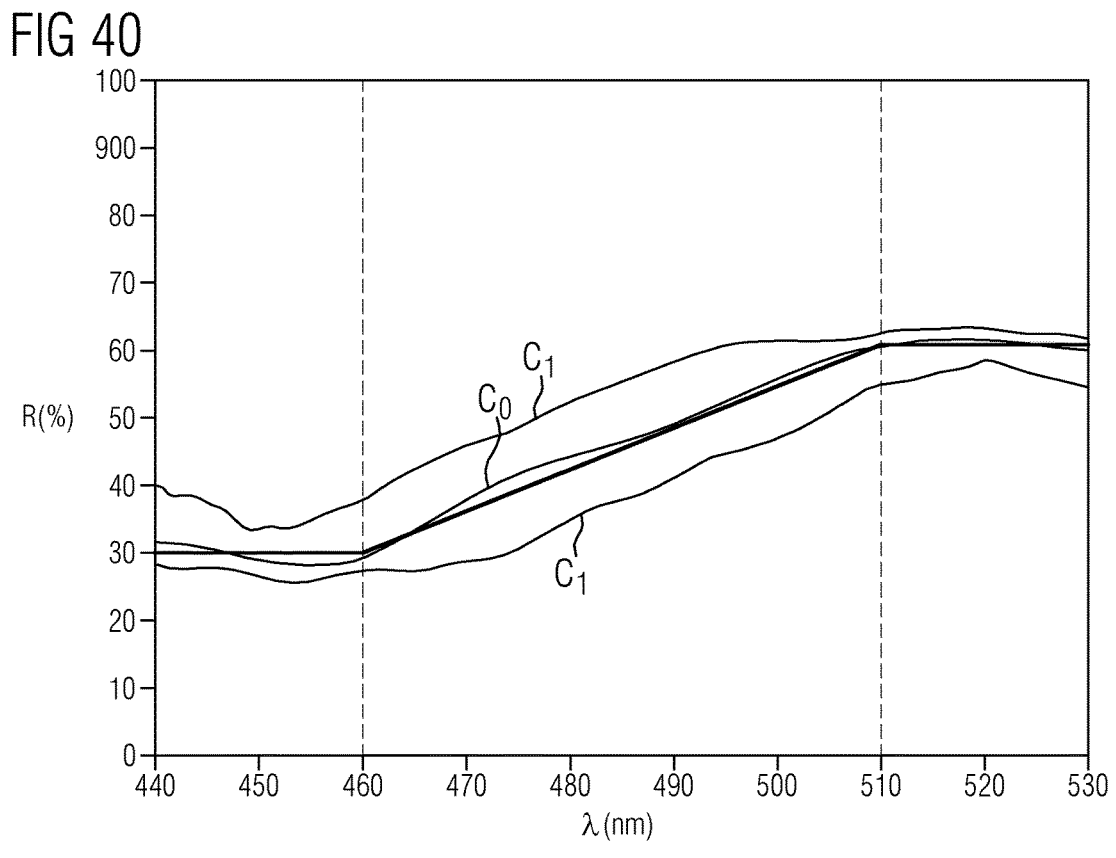
FIGS. 40 and 41 show simulated values of the reflectivity R as a function of the wavelength 2 of incident electromagnetic radiation for a coating in accordance with one exemplary embodiment.

FIG. 40 shows simulated values of the reflectivity R as a function of the wavelength λ, of incident electromagnetic radiation for a first coating and a second coating each having a multiplicity of individual layers, the material, thickness, refractive index and order of which are indicated in table 10.

TABLE 10

| | Material | Thickness (nanometers) | Refractive index n |
|---|---|---|---|
| | Laser | | 2.5 |
| First coating | SiO₂ | 69 | 1.5 |
| First coating | TiO₂ | 64 | 2.2 |
| First coating | SiO₂ | 248 | 1.5 |
| First coating | TiO₂ | 40 | 2.2 |
| First coating | SiO₂ | 167 | 1.5 |
| First coating | TiO₂ | 32 | 2.2 |
| Cutout | SiO₂ | 1000 | 1.5 |
| Second coating | TiO₂ | 12.5 | 2.2 |
| Second coating | SiO₂ | 65.1 | 1.5 |
| Second coating | TiO₂ | 15.6 | 2.2 |
| Second coating | SiO₂ | 96.7 | 1.5 |
| Second coating | TiO₂ | 25 | 2.2 |
| Second coating | SiO₂ | 26.9 | 1.5 |
| | Laser | | 2.5 |

The thickness of the first coating and the thickness of the second coating are in a ratio of 2.56:1. In particular, the reflectivity of the two coatings is set in such a way that said coatings have different reflectivities for different wavelength ranges. In the present case, the reflectivity amounts to approximately 30% in the blue spectral range and approximately 60% in the green spectral range.

Figure 41:
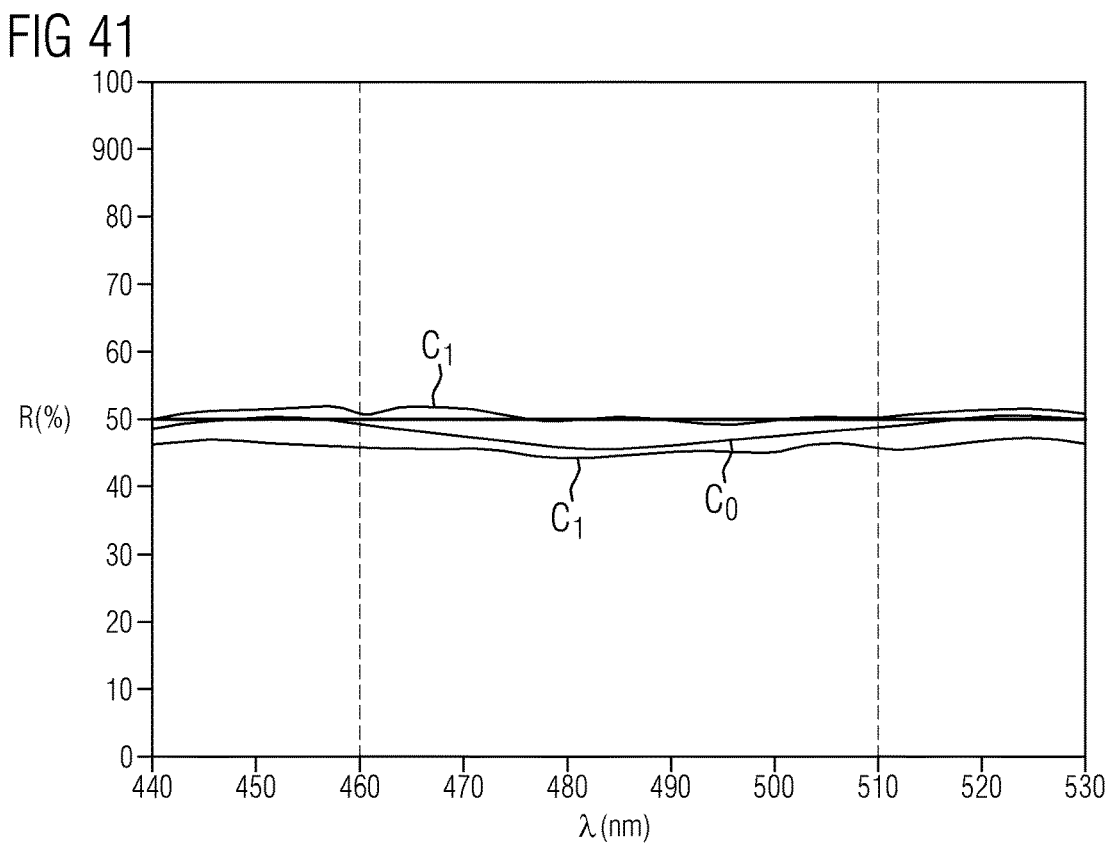

FIG. 41 shows simulated values of the reflectivity R as a function of the wavelength λ of incident electromagnetic radiation for a first coating and a second coating each having a multiplicity of individual layers, the material, thickness, refractive index and order of which are indicated in table 11.

TABLE 11

| | Material | Thickness (nanometers) | Refractive index n |
|---|---|---|---|
| | Laser | | 2.5 |
| First coating | TiO₂ | 271 | 2.2 |

TABLE 11-continued

| | Material | Thickness (nanometers) | Refractive index n |
|---|---|---|---|
| First coating | SiO$_2$ | 90 | 1.5 |
| First coating | TiO$_2$ | 46 | 2.2 |
| First coating | SiO$_2$ | 102 | 1.5 |
| First coating | TiO$_2$ | 38 | 2.2 |
| Cutout | SiO$_2$ | 1000 | 1.5 |
| Second coating | TiO$_2$ | 7.6 | 2.2 |
| Second coating | SiO$_2$ | 20.4 | 1.5 |
| Second coating | TiO$_2$ | 9.2 | 2.2 |
| Second coating | SiO$_2$ | 18 | 1.5 |
| Second coating | TiO$_2$ | 54.2 | 2.2 |
| | Laser | | 2.5 |

The thickness of the first coating and the thickness of the second coating are in a ratio of 5:1. In particular, the reflectivity of the two coatings is set in such a way as to be approximately identical in the blue spectral range and in the green spectral range.

Figure 42:
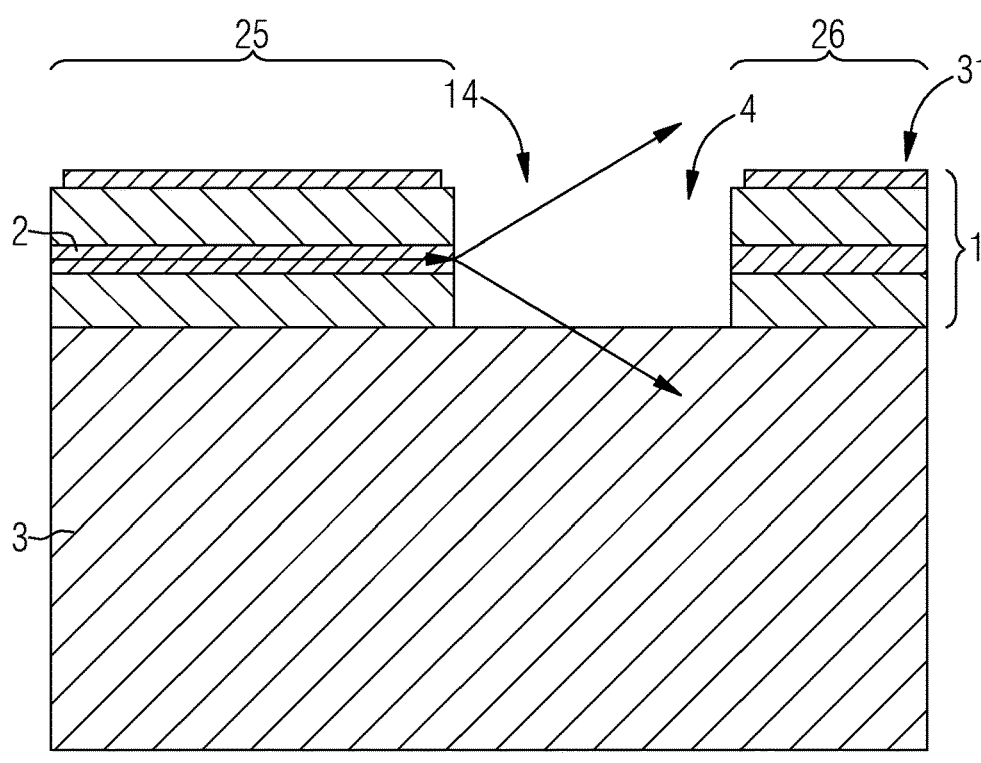
FIGS. 42 and 43 show schematic sectional illustrations of a radiation-emitting semiconductor chip in accordance with a further exemplary embodiment.
Figure 43:
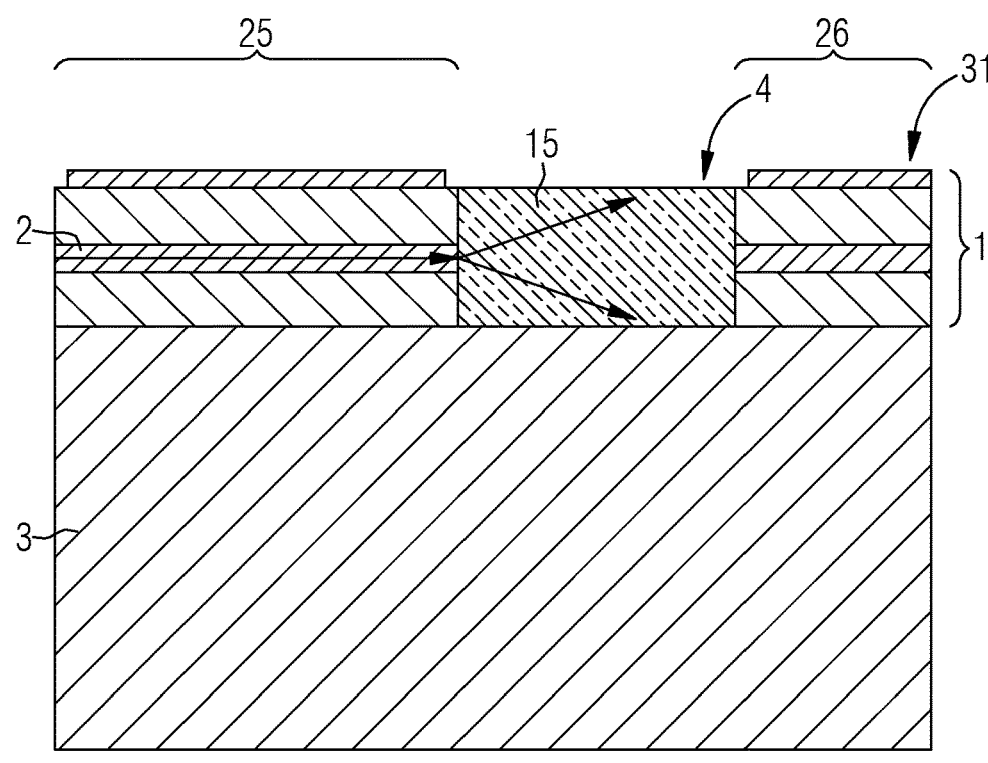

The radiation-emitting semiconductor chips 31 in accordance with the exemplary embodiments in FIGS. 42 and 43 have two segments 25, 26, of which the first segment 25 generates electromagnetic laser radiation during operation, while the second segment 26 is a switching segment 32 provided and configured for switching the radiation-emitting semiconductor chip 31 on and off. The two segments 25, 26 are separated from one another by a cutout 4.

In the case of the radiation-emitting semiconductor chip 31 in accordance with the exemplary embodiment in FIG. 42, the region 14 of the cutout 4 is not completely filled with a first coating 10 and a second coating 13 on opposite side surfaces 6, 7. Rather, a region 14 between the two coatings 6, 7 in the cutout 4 is filled with air. As illustrated schematically by the two arrows, it is desirable for a width of the cutout not to be made too large, in order that as much electromagnetic laser radiation as possible from the first segment 25 can enter the second segment 26. Preferably, a width of the cutout is at most 800 nanometers, at most 15 micrometers, at most 5 micrometers and particularly preferably at most 2 micrometers wide.

In the case of the radiation-emitting semiconductor chip 31 in accordance with the exemplary embodiment in FIG. 42, the region 14 of the cutout 4 between the first coating 10 and the second coating 13 is filled by a material 15 having a refractive index of greater than 1. As illustrated by the arrows in FIG. 43, a filling of the cutout 4 with such a material also increases the electromagnetic laser radiation that enters the second segment 26.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. A radiation-emitting semiconductor chip comprising:
a semiconductor body comprising an active region which, during operation, generates electromagnetic radiation and is arranged in a resonator,
at least one cutout in the semiconductor body which completely penetrates through the active region,
wherein
the cutout has a first side surface and a second side surface opposite the first side surface, and
the first side surface has a first coating, which predefines a reflectivity for the electromagnetic radiation of the active region, and/or
the second side surface has a second coating, which predefines a reflectivity for the electromagnetic radiation of the active region,
wherein
a second layer sequence is embodied in identical fashion to the first layer sequence apart from an additional symmetry breaking layer, or
a first layer sequence is embodied in identical fashion to the second layer sequence apart from an additional symmetry breaking layer.

2. The radiation-emitting semiconductor chip as claimed in claim 1, wherein
the first coating is embodied as the first layer sequence having a multiplicity of individual layers, and/or
the second coating is embodied as the second layer sequence having a multiplicity of individual layers.

3. The radiation-emitting semiconductor chip as claimed in claim 1, wherein the first coating and the second coating are embodied differently from one another.

4. The radiation-emitting semiconductor chip as claimed in claim 2, wherein
the first layer sequence and the second layer sequence are formed from individual layers of identical materials and with an identical succession, and
a thickness of the first layer sequence in the region of the first side surface and a thickness of the second layer sequence in the region of the second side surface are different from one another.

5. The radiation-emitting semiconductor chip as claimed in claim 4, wherein
the thickness of the first layer sequence in the region of the first side surface and the thickness of the second layer sequence in the region of the second side surface are in a ratio of greater than 1:1 and less than or equal to 1:20.

6. The radiation-emitting semiconductor chip as claimed in claim 1, wherein
the semiconductor body comprises a first segment and a second segment, the first segment being electrically and/or optically isolated from the second segment by the cutout.

7. The radiation-emitting semiconductor chip as claimed in claim 6, wherein the first segment comprises the resonator and the second segment comprises a modulation element configured to modulate an intensity of the electromagnetic radiation of the active region.

8. The radiation-emitting semiconductor chip as claimed in claim 7, wherein
the first segment and the second segment are electrically isolated from one another, and
the second segment comprises an electrical switching element configured to switch on and switch off the radiation-emitting semiconductor chip.

9. The radiation-emitting semiconductor chip as claimed in claim 6, wherein the semiconductor body has at least one of the first segment, the second segment, and/or a third segment comprises one or more of the following elements: photodiode, passive waveguide, active waveguide, beam splitter, beam combiner, lens, wavelength-selective element, phase shifting elements, frequency doubler, taper, amplifier, converter, transistor.

10. The radiation-emitting semiconductor chip as claimed in claim 1, wherein a refractive index progression along a main extension direction of the semiconductor chip proceeding from the first side surface of the cutout as far as the second side surface of the cutout is embodied in nonperiodic fashion.

11. An array comprising at least two radiation-emitting semiconductor chips as claimed in claim 1.

12. A method for producing a radiation-emitting semiconductor chip comprising:

providing a semiconductor body comprising an active region which, during operation, generates electromagnetic radiation, and is arranged in a resonator, producing at least one cutout in the semiconductor body which completely penetrates through the active region, the cutout having a first side surface and a second side surface, the first side surface being arranged opposite the second side surface, and applying a first coating, which predefines a reflectivity for the electromagnetic radiation of the active region, to the first side surface, and/or applying a second coating, which predefines a reflectivity for the electromagnetic radiation of the active region, to the second side surface, wherein before the first coating and the second coating are applied, a shading element is applied to a region of a main surface of the semiconductor body which directly adjoins the first side surface of the cutout, such that a thickness of the first coating in the region of the first side surface is different from a thickness of the second coating in the region of the second side surface.

13. The method as claimed in claim 12, wherein the second side surface of the cutout is provided with a protective layer, the first side surface of the cutout is provided with the first coating, and the protective layer is removed, such that the semiconductor body is freely accessible in the region of the second side surface.

14. The method as claimed in claim 13, wherein the first coating is provided with a further protective layer at least in the region of the first side surface, and the second side surface of the cutout is provided with the second coating, and the further protective layer is removed, such that the first coating is freely accessible in the region of the first side surface.

15. The method as claimed in claim 12, wherein the first coating and the second coating are simultaneously applied to the first side surface and the second side surface, wherein the first coating is embodied as a first layer sequence of a multiplicity of individual layers, and the second coating is embodied as a second layer sequence of a multiplicity of individual layers, the first layer sequence and the second layer sequence are formed from individual layers of identical materials and with an identical succession, and the thickness of the first layer sequence in the region of the first side surface and the thickness of the second layer sequence in the region of the second side surface are in a ratio of between not less than 1:1 and not more than 1:20.

16. The method as claimed in claim 15, wherein a preferred direction of a method for applying the first coating and the second coating forms a predefined angle with a main extension plane of the semiconductor body, such that the thickness of the first coating in the region of the first side surface is different from the thickness of the second coating in the region of the second side surface.

17. The method as claimed in claim 12, wherein a multiplicity of semiconductor bodies are provided in a wafer assemblage, separating trenches are arranged between the semiconductor bodies, a layer sequence comprising a first layer and a second layer is deposited in the separating trenches, the semiconductor bodies are singulated along the separating trenches in such a way that the first layer is arranged on a side surface of a semiconductor body and the second layer is arranged on a side surface of a directly adjacent semiconductor body.

18. A radiation-emitting semiconductor chip comprising:

a semiconductor body comprising an active region which, during operation, generates electromagnetic radiation and is arranged in a resonator, at least one cutout in the semiconductor body which completely penetrates through the active region, wherein the cutout has a first side surface and a second side surface opposite the first side surface, and the first side surface has a first coating, which predefines a reflectivity for the electromagnetic radiation of the active region, and/or the second side surface has a second coating, which predefines a reflectivity for the electromagnetic radiation of the active region, and wherein a first layer sequence and a second layer sequence are formed from individual layers of identical materials and with an identical succession, and a thickness of the first layer sequence in the region of the first side surface and a thickness of the second layer sequence in the region of the second side surface are different from one another.

\* \* \* \* \*